(12) United States Patent
Noda et al.

(10) Patent No.: US 8,519,509 B2
(45) Date of Patent: Aug. 27, 2013

(54) SEMICONDUCTOR DEVICE AND MANUFACTURING METHOD THEREOF

(75) Inventors: Kosei Noda, Kanagawa (JP); Seiji Yasumoto, Tochigi (JP); Kensuke Yoshizumi, Kanagawa (JP); Toshiyuki Miyamoto, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 73 days.

(21) Appl. No.: 13/082,468

(22) Filed: Apr. 8, 2011

(65) Prior Publication Data

US 2011/0254122 A1 Oct. 20, 2011

(30) Foreign Application Priority Data

Apr. 16, 2010 (JP) .................. 2010-095243

(51) Int. Cl.
*H01L 29/00* (2006.01)
*H01L 29/04* (2006.01)
*H01L 31/036* (2006.01)
*H01L 27/10* (2006.01)

(52) U.S. Cl.
USPC ............ 257/530; 257/50; 257/528; 257/529; 257/209

(58) Field of Classification Search
USPC ................. 257/530, 50, 379, 528, 529, 209, 257/665
See application file for complete search history.

(56) References Cited

U.S. PATENT DOCUMENTS

| | | | |
|---|---|---|---|
| 5,070,384 | A | 12/1991 | McCollum et al. |
| 5,171,715 | A | 12/1992 | Husher et al. |
| 5,181,096 | A | 1/1993 | Forouhi et al. |
| 5,210,598 | A | 5/1993 | Nakazaki et al. |
| 5,272,101 | A | 12/1993 | Forouhi et al. |
| 5,314,840 | A | 5/1994 | Schepis et al. |
| 5,381,035 | A | 1/1995 | Chen et al. |
| 5,387,812 | A | 2/1995 | Forouhi et al. |
| 5,404,029 | A | 4/1995 | Husher et al. |
| 5,411,917 | A | 5/1995 | Forouhi et al. |
| 5,464,790 | A | 11/1995 | Hawley et al. |
| 5,525,830 | A | 6/1996 | Chen et al. |
| 5,541,441 | A | 7/1996 | Yeuochung et al. |
| 5,543,656 | A | 8/1996 | Yen et al. |
| 5,552,627 | A | 9/1996 | McCollum et al. |

(Continued)

FOREIGN PATENT DOCUMENTS

| | | |
|---|---|---|
| JP | 04-282864 | 10/1992 |
| JP | 05-343633 | 12/1993 |
| JP | 07-297293 | 11/1995 |

*Primary Examiner* — Chuong A. Luu
(74) *Attorney, Agent, or Firm* — Eric J. Robinson; Robinson Intellectual Property Law Offices, P.C.

(57) ABSTRACT

An object of one embodiment of the present invention is to provide an antifuse which has low writing voltage. The antifuse is used for a memory element for a read only memory device. The antifuse includes a first conductive layer, an insulating layer, a semiconductor layer, and a second conductive layer. The insulating layer included in the antifuse is a silicon oxynitride layer formed by adding ammonia to a source gas. When hydrogen is contained in the layer at greater than or equal to $1.2 \times 10^{21}$ atoms/cm$^3$ and less than or equal to $3.4 \times 10^{21}$ atoms/cm$^3$ or nitrogen is contained in the layer at greater than or equal to $3.2 \times 10^{20}$ atoms/cm$^3$ and less than or equal to $2.2 \times 10^{21}$ atoms/cm$^3$, writing can be performed at low voltage.

28 Claims, 20 Drawing Sheets

(56) References Cited

U.S. PATENT DOCUMENTS

| | | |
|---|---|---|
| 5,578,836 A | 11/1996 | Husher et al. |
| 5,614,756 A | 3/1997 | Forouhi et al. |
| 5,633,189 A | 5/1997 | Yen et al. |
| 5,670,818 A | 9/1997 | Forouhi et al. |
| 5,763,898 A | 6/1998 | Forouhi et al. |
| 5,770,885 A | 6/1998 | McCollum et al. |
| 5,780,323 A | 7/1998 | Forouhi et al. |
| 5,817,549 A | 10/1998 | Yamazaki et al. |
| 5,866,937 A | 2/1999 | McCollum et al. |
| 6,001,693 A | 12/1999 | Yeouchung et al. |
| 6,028,325 A | 2/2000 | Yamazaki |
| 6,051,851 A | 4/2000 | Ohmi et al. |
| 2008/0224140 A1* | 9/2008 | Tokunaga et al. ............... 257/57 |
| 2008/0224229 A1* | 9/2008 | Tajima et al. ................. 257/379 |
| 2008/0224940 A1 | 9/2008 | Sugiyama et al. |
| 2009/0289340 A1 | 11/2009 | Yamazaki et al. |

* cited by examiner

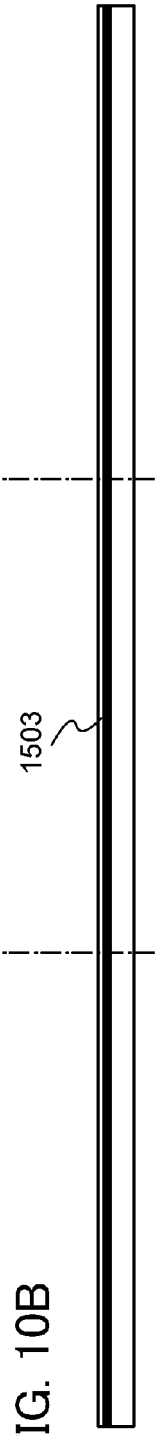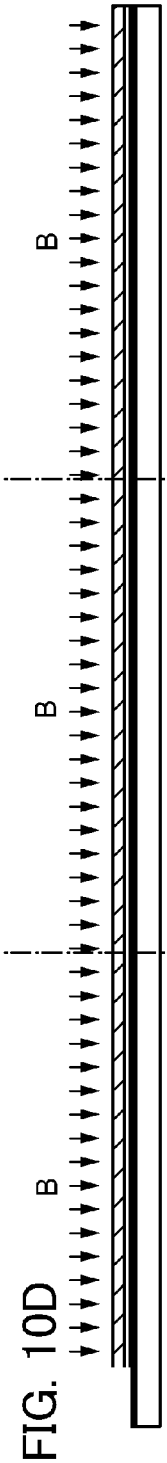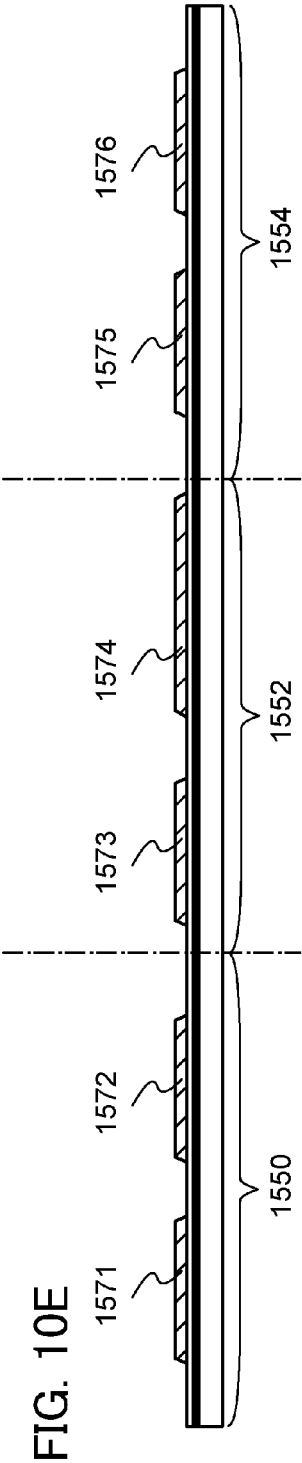

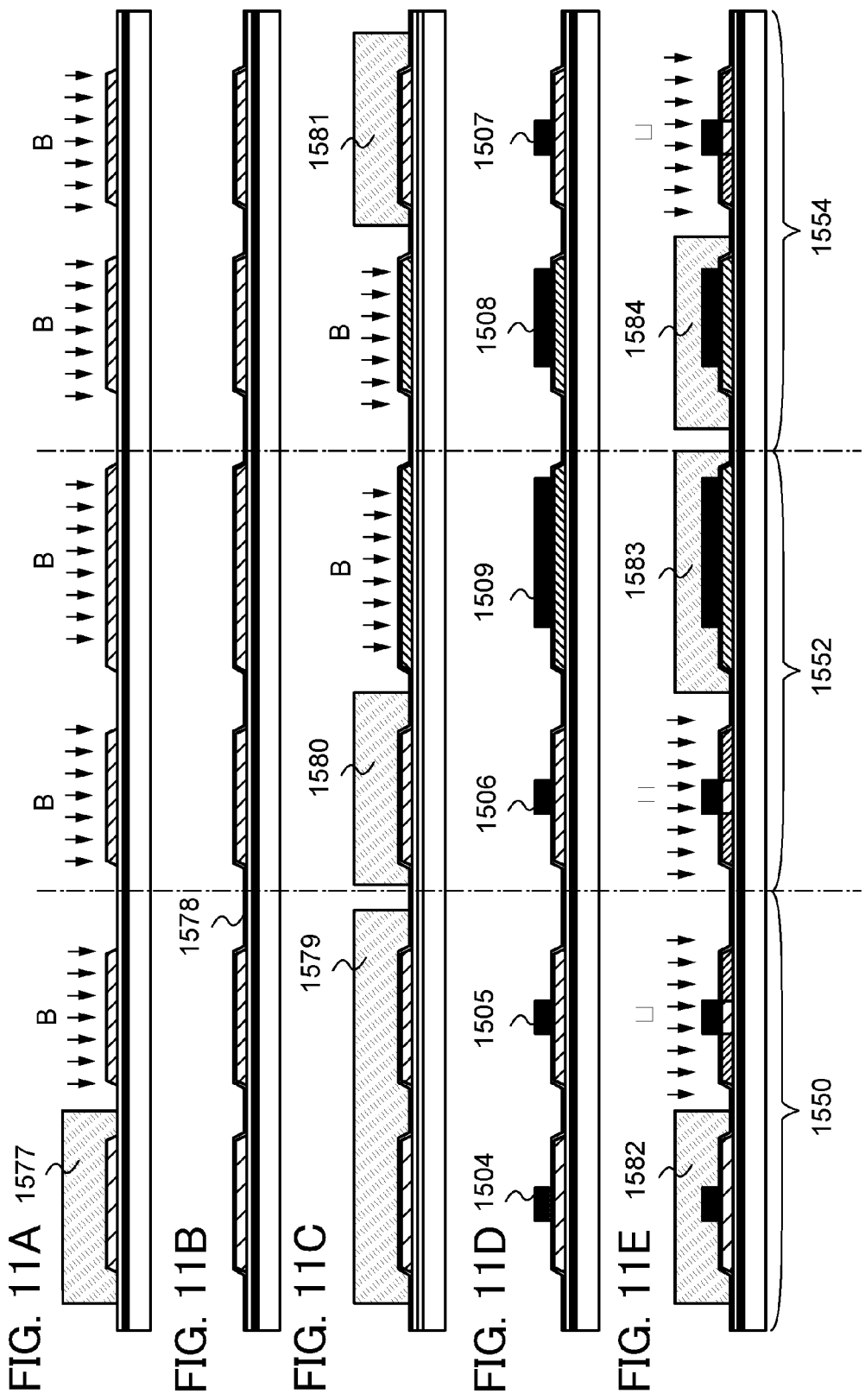

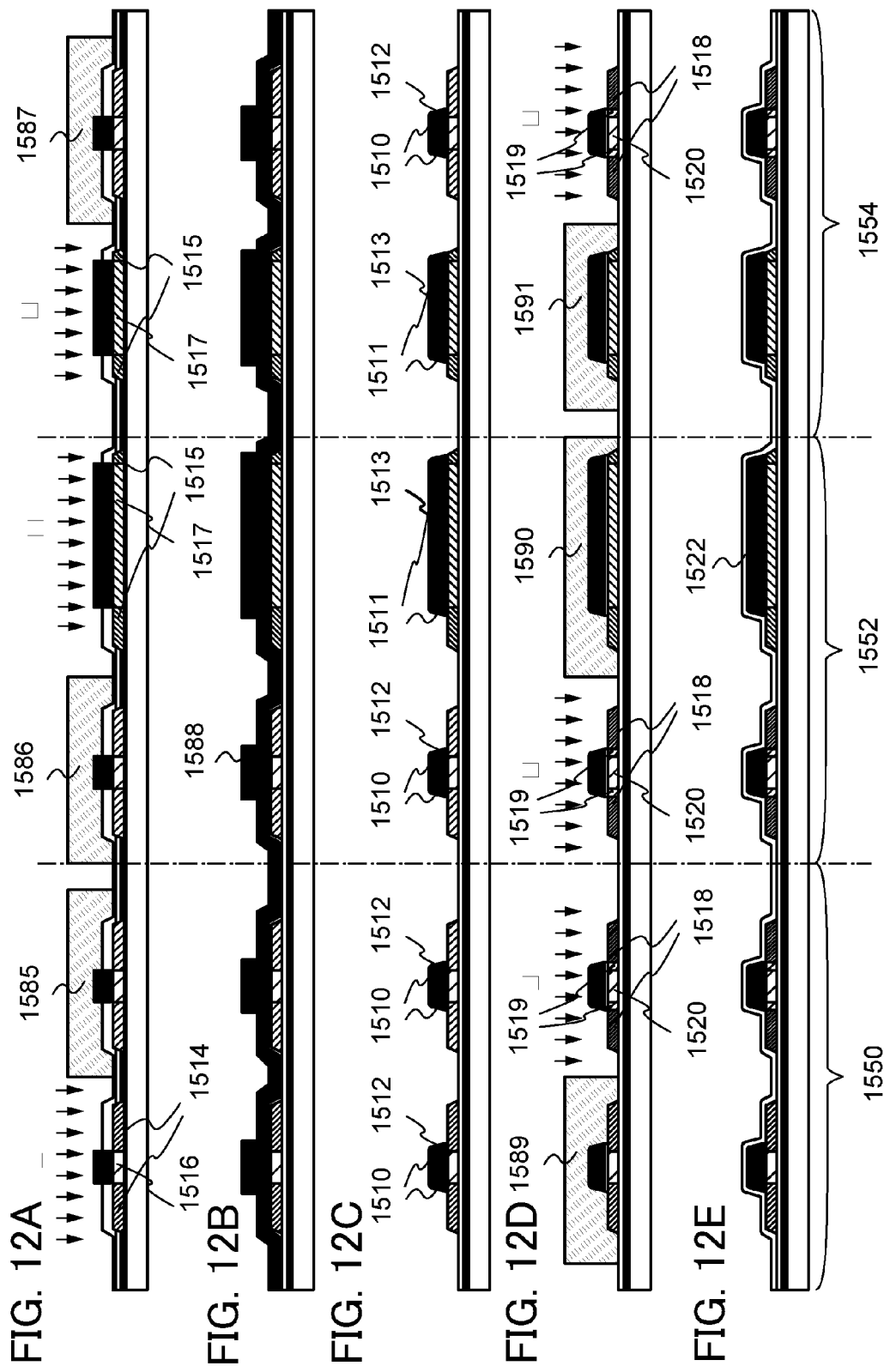

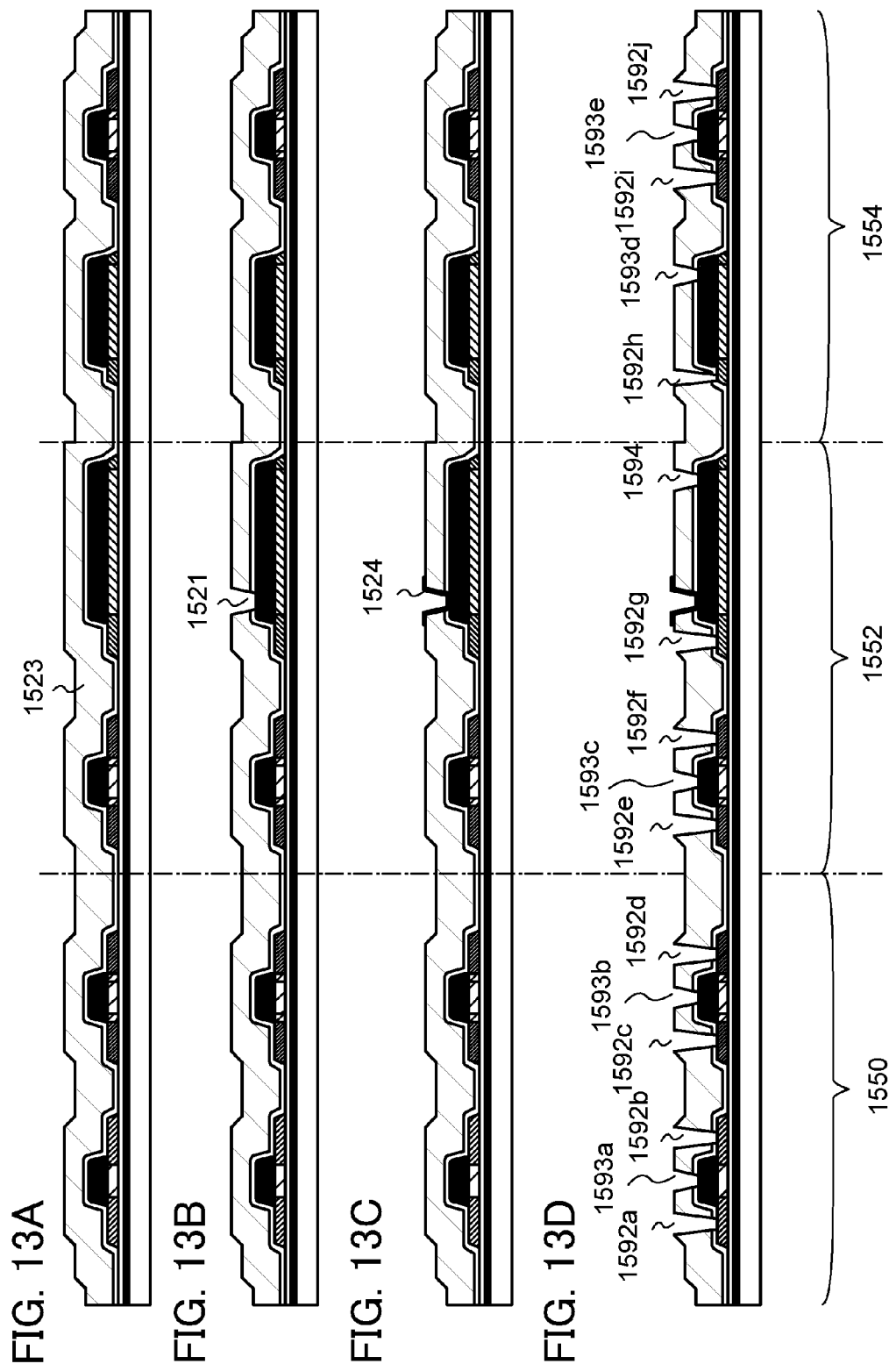

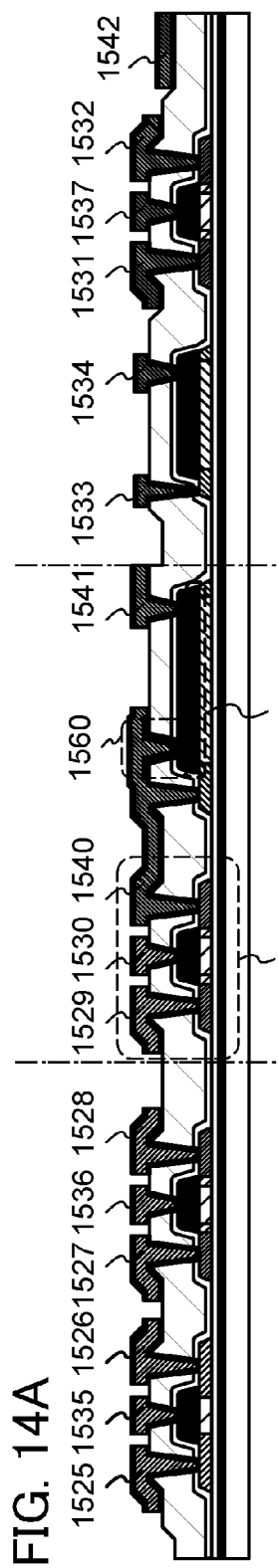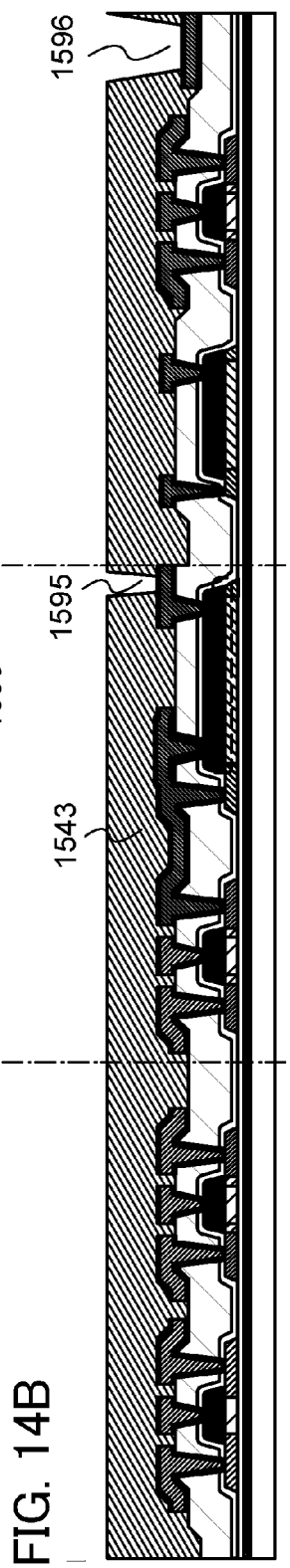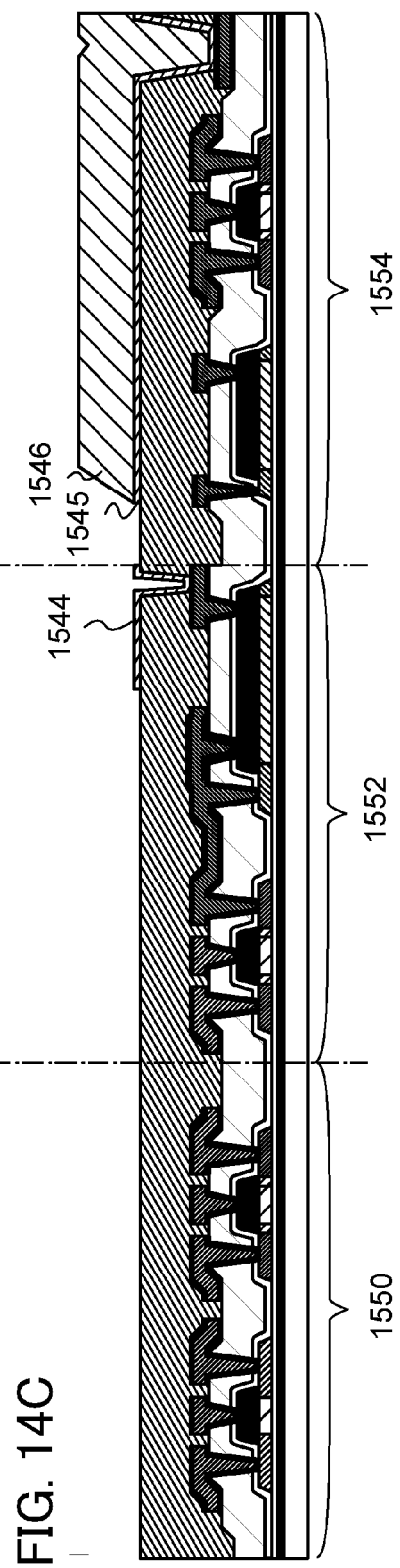

400

400

400

400

400

400

SEMICONDUCTOR DEVICE AND MANUFACTURING METHOD THEREOF

BACKGROUND OF THE INVENTION

1. Field of the Invention

The present invention relates to a semiconductor device including an antifuse and a manufacturing method thereof.

Note that the semiconductor device in this specification refers to all devices that can function by utilizing semiconductor characteristics, and electro-optic devices, semiconductor circuits, and electronic appliances are all semiconductor devices.

2. Description of the Related Art

A ROM (read only memory), which performs only reading, is classified into a mask ROM and a PROM (programmable ROM). A fuse ROM and an antifuse ROM are a kind of PROM. The mask ROM is a ROM to which information is written using a photomask in a manufacturing process. The fuse ROM is a ROM in which a fuse that is in a conductive state in a manufacturing process is used as a memory element and information is written in such a manner that the fuse is disconnected by current flowing after the manufacture. On the other hand, the antifuse ROM is a ROM in which an antifuse that is in a non-conductive state in a manufacturing process is used as a memory element and information is written in such a manner that the antifuse is short-circuited by current flowing after the manufacture.

In Patent Document 1, an antifuse in which amorphous silicon is interposed between a pair of conductors is described. One of electrodes is formed of metal, and the amorphous silicon and the metal are made to react with each other to form silicide, whereby the antifuse is placed in a conductive state.

In Patent Document 2, an antifuse having a structure in which an amorphous silicon film containing germanium is interposed between wirings is described. The proportion of germanium in the amorphous silicon film is adjusted and the crystallization temperature of the amorphous silicon film is decreased, whereby writing voltage can be lowered.

In Patent Document 3, an antifuse formed using a stacked body of an electrode, silicon nitride, amorphous silicon, silicon nitride, an electrode, and the like is described.

REFERENCE

Patent Document

[Patent Document 1] Japanese Published Patent Application No. 07-297293
[Patent Document 2] Japanese Published Patent Application No. H5-343633
[Patent Document 3] Japanese Published Patent Application No. H4-282864

SUMMARY OF THE INVENTION

As described above, a variety of materials and structures are proposed for an antifuse formed so that a semiconductor, an insulator, or a stacked layer thereof is interposed between electrodes, and it is desired to improve reliability and reduce writing voltage (lower power consumption).

An object of an embodiment of the present invention is to provide a semiconductor device including an antifuse in which writing and reading can be performed with high reliability and writing can be performed at low voltage. In addition, another object is to provide a manufacturing method of the semiconductor device including an antifuse.

An embodiment of the present invention disclosed in this specification relates to a semiconductor device in which an antifuse is used as a memory element and a manufacturing method thereof. A layer between a pair of conductive layers included in the antifuse is formed using an insulating layer whose composition is limited and a semiconductor layer, so that writing to the antifuse can be performed at low voltage.

An embodiment of the present invention disclosed in this specification is a semiconductor device including a plurality of memory cells each including an antifuse. The antifuse includes a first conductive layer, an intermediate layer over the first conductive layer, and a second conductive layer over the intermediate layer. The intermediate layer is a stacked layer of an insulating layer and a semiconductor layer. The insulating layer is a silicon oxynitride film including hydrogen at greater than or equal to $1.2 \times 10^{21}$ atoms/cm$^3$ and less than or equal to $3.4 \times 10^{21}$ atoms/cm$^3$.

Another embodiment of the present invention disclosed in this specification is a semiconductor device including a memory portion including a plurality of memory cells each including an antifuse; a semiconductor integrated circuit portion connected to the memory portion; an antenna portion connected to the semiconductor integrated circuit portion; and a first insulator and a second insulator between which a structure including the memory portion, the semiconductor integrated circuit portion, and the antenna portion is sandwiched. The antifuse includes a first conductive layer, an intermediate layer over the first conductive layer, and a second conductive layer over the intermediate layer. The intermediate layer is a stacked layer of an insulating layer and a semiconductor layer. The insulating layer is a silicon oxynitride film including hydrogen at greater than or equal to $1.2 \times 10^{21}$ atoms/cm$^3$ and less than or equal to $3.4 \times 10^{21}$ atoms/cm$^3$.

The above insulating layer may include nitrogen at greater than or equal to $3.2 \times 10^{20}$ atoms/cm$^3$ and less than or equal to $2.2 \times 10^{21}$ atoms/cm$^3$.

Another embodiment of the present invention disclosed in this specification is a semiconductor device including a plurality of memory cells each including an antifuse. The antifuse includes a first conductive layer, an intermediate layer over the first conductive layer, and a second conductive layer over the intermediate layer. The intermediate layer is a stacked layer of an insulating layer and a semiconductor layer. The insulating layer is a silicon oxynitride film including nitrogen at greater than or equal to $3.2 \times 10^{20}$ atoms/cm$^3$ and less than or equal to $2.2 \times 10^{21}$ atoms/cm$^3$.

Another embodiment of the present invention disclosed in this specification is a semiconductor device including a memory portion including a plurality of memory cells each including an antifuse; a semiconductor integrated circuit portion connected to the memory portion; an antenna portion connected to the semiconductor integrated circuit portion; and a first insulator and a second insulator between which a structure including the memory portion, the semiconductor integrated circuit portion, and the antenna portion is sandwiched. The antifuse includes a first conductive layer, an intermediate layer over the first conductive layer, and a second conductive layer over the intermediate layer. The intermediate layer is a stacked layer of an insulating layer and a semiconductor layer. The insulating layer is a silicon oxynitride film including nitrogen at greater than or equal to $3.2 \times 10^{20}$ atoms/cm$^3$ and less than or equal to $2.2 \times 10^{21}$ atoms/cm$^3$.

An antifuse according to one embodiment of the present invention includes a first conductive layer, a second conductive layer, and an intermediate layer interposed between the first conductive layer and the second conductive layer. The intermediate layer is a stacked layer of an insulating layer and a semiconductor layer. In addition, there are two kinds of structures of the intermediate layer: a structure in which the insulating layer and the semiconductor layer are stacked over a substrate in this order and a structure in which the semiconductor layer and the insulating layer are stacked over the substrate in this order. These structures are all included in the category of the present invention.

The semiconductor layer used for the intermediate layer can be formed using a semiconductor which is mainly composed of silicon or germanium. For example, as the semiconductor containing silicon as its main component, there are silicon, $Si_xGe_{1-x}$ ($0.5 \leq x<1$; that is, x is greater than or equal to 0.5 and less than 1), and the like. As the semiconductor containing germanium as its main component, there are germanium, $Si_xGe_{1-x}$ ($0<x \leq 0.5$; that is, x is greater than 0 and less than or equal to 0.5), and the like. A phase structure of non-single crystal such as an amorphous structure, a microcrystalline structure, or a polycrystalline structure can be used for the semiconductor layer.

The thickness of the semiconductor layer can be greater than or equal to 5 nm and less than or equal to 200 nm. The thickness is preferably greater than or equal to 10 nm and less than or equal to 100 nm, more preferably greater than or equal to 10 nm and less than or equal to 55 nm.

The insulating layer used for the intermediate layer can be formed using an oxide of a semiconductor such as silicon, germanium, or silicon germanium or an oxide of a metal. Alternatively, nitride and oxynitride can be used instead of oxide. In particular, oxynitride is preferably used.

The thickness of the insulating layer can be set to greater than or equal to 1 nm and less than or equal to 20 nm. The thickness is more preferably greater than or equal to 1 nm and less than or equal to 15 nm.

The pair of conductive layers included in the antifuse can be formed using a single metal of aluminum, titanium, tungsten, nickel, chromium, molybdenum, tantalum, cobalt, zirconium, vanadium, palladium, hafnium, platinum, iron, or the like, nitride thereof, an alloy thereof, or a stacked layer thereof.

The semiconductor integrated circuit portion, the memory portion, and the antenna portion are sandwiched between a first insulator and a second insulator which are structure bodies impregnated with organic resins. Wireless communication with an external device can be conducted through the antenna portion.

Another embodiment of the present invention disclosed in this specification is a manufacturing method of a semiconductor device, including the steps of: forming a semiconductor integrated circuit and a memory portion by the steps of forming a metal layer over a substrate; forming a metal oxide layer over the metal layer, forming a first insulating layer over the metal oxide layer, forming a semiconductor layer over the first insulating layer, forming a gate insulating layer over the semiconductor layer, forming a gate electrode and a first electrode over the gate insulating layer, forming a second insulating layer over the gate insulating layer, the gate electrode, and the first electrode, forming an opening which reaches the first electrode in the second insulating layer, forming an intermediate layer over the first electrode, forming an opening which reaches the semiconductor layer in the gate insulating layer, and forming a source electrode and a drain electrode which are in contact with the semiconductor layer and forming a second electrode in contact with the intermediate layer; forming a third insulating layer over the semiconductor integrated circuit portion and the memory portion; forming an antenna portion by forming an antenna over the third insulating layer; causing separation at an interface between the metal oxide layer and the first insulating layer or an interface between the metal layer and the metal oxide layer to transfer the semiconductor integrated circuit portion, the memory portion, and the antenna portion to a first insulator; and bonding a second insulator to the first insulator so that the semiconductor integrated circuit portion, the memory portion, and the antenna portion are sandwiched between the first insulator and the second insulator.

The above intermediate layer can be formed using a stacked layer of the insulating layer and the semiconductor layer which are described above. A silicon oxynitride film and an amorphous silicon film are preferably used as the insulating layer and the semiconductor layer, respectively.

A plasma CVD method is preferably used for forming the insulating layer, and a source gas including silane, dinitrogen monoxide, and ammonia is preferably used. In addition, the source gas preferably includes ammonia in a range of greater than or equal to 1.6% and less than or equal to 11.1% of the total flow rate.

According to one embodiment of the present invention, an antifuse in which writing and reading can be performed with high reliability and writing can be performed at low voltage can be provided. Writing voltage is reduced, which increases the degree of freedom for circuit design and reduction in power consumption of the whole semiconductor device can be realized.

BRIEF DESCRIPTION OF THE DRAWINGS

FIGS. 10A to 10E are cross-sectional views illustrating a manufacturing method of a semiconductor device.

FIGS. 11A to 11E are cross-sectional views illustrating a manufacturing method of a semiconductor device.

FIGS. 12A to 12E are cross-sectional views illustrating a manufacturing method of a semiconductor device.

FIGS. 13A to 13D are cross-sectional views illustrating a manufacturing method of a semiconductor device.

FIGS. 14A to 14C are cross-sectional views illustrating a manufacturing method of a semiconductor device.

DETAILED DESCRIPTION OF THE INVENTION

Figure 1A:
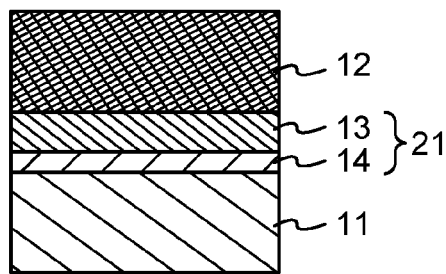
FIGS. 1A and 1B are each a cross-sectional view of an antifuse.

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in the drawings for explaining the embodiments, the same parts or parts having a similar function are denoted by the same reference numerals, and description of such parts is not repeated.

(Embodiment 1)

In this embodiment, a structure of an antifuse will be described with reference to FIGS. 1A and 1B. In addition, a manufacturing method of the antifuse will be described.

Figure 1B:
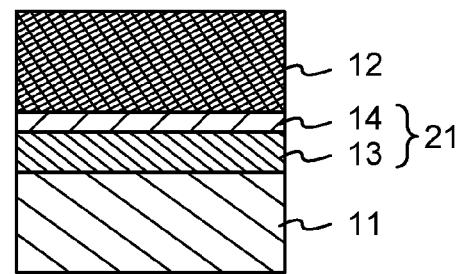

FIGS. 1A and 1B are each a cross-sectional view of the antifuse. As illustrated in FIGS. 1A and 1B, the antifuse includes a first conductive layer 11; a second conductive layer 12; and an intermediate layer 21 between the first conductive layer 11 and the second conductive layer 12, in which a semiconductor layer 13 and an insulating layer 14 are stacked. In the explanation below, a layer between two conductive layers in an antifuse is referred to as an intermediate layer.

The intermediate layer 21 in FIG. 1A is a layer in which the insulating layer 14 and the semiconductor layer 13 are stacked in this order from the first conductive layer 11 side; however, a layer in which the semiconductor layer 13 and the insulating layer 14 are stacked in this order may be used as illustrated in FIG. 1B.

Voltage is applied between the first conductive layer 11 and the second conductive layer 12, whereby writing to the antifuses in FIGS. 1A and 1B is performed. By application of voltage, the resistance of the intermediate layer 21 is decreased, and the first conductive layer 11 and the second conductive layer 12 are brought into conduction.

The semiconductor layer 13 is not limited to a single layer, and a stacked layer of different semiconductor materials may be used. A material containing silicon or germanium as its main component can be used as a semiconductor material which forms the semiconductor layer 13. As the material containing silicon as its main component, there are silicon (Si), silicon germanium ($Si_xGe_{1-x}$ ($0.5 \leq x < 1$; that is, x is greater than or equal to 0.5 and less than 1)), silicon carbide (SiC), and the like. As the material containing germanium as its main component, there are germanium (Ge), silicon germanium ($Si_xGe_{1-x}$ ($0 < x \leq 0.5$; that is, x is greater than 0 and less than or equal to 0.5)), and the like.

A crystal structure of the semiconductor containing silicon or germanium as its main component, which forms the semiconductor film 13, is a non-single-crystal structure, and an amorphous structure with small electrical conductivity is preferably used in order to suppress leakage current. However, a microcrystalline structure or a polycrystalline structure can be used.

The semiconductor layer 13 can be formed by a CVD method or a sputtering method. In the case where a silicon film is formed by a CVD method, silane ($SiH_4$) or disilane ($Si_2H_6$) may be used as a source gas. In the case where a germanium film is formed by a CVD method, germane ($GeH_4$) may be used as a source gas. In the case where a silicon germanium film is formed, $GeH_4$, and $SiH_4$ or $Si_2H_6$ may be used as a source gas. The proportions of Si and Ge contained in the silicon germanium film can be controlled by change of a flow ratio in the source gas. In the case where a silicon film, a germanium film, or a silicon germanium film is formed by a sputtering method, a target of a material which is desired to be formed may be used. For example, in the case where a silicon film is formed, a target of single crystal silicon or polycrystalline silicon can be used.

The semiconductor layer 13 can be formed to a thickness of greater than or equal to 5 nm and less than or equal to 200 nm, preferably greater than or equal to 10 nm and less than or equal to 100 nm, more preferably greater than or equal to 10 nm and less than or equal to 55 nm.

The insulating layer 14 is formed as a layer having higher resistance than the semiconductor layer 13. The insulating layer 14 is not limited to a single layer, and a stacked layer of different insulating materials may be used.

As an insulating material which can be used for the insulating layer 14, there are, for example, oxide, nitride, and oxynitride of the above-described semiconductor containing silicon or germanium as its main component. Specifically, as the insulating material, there are silicon oxide ($SiO_x$), silicon nitride ($SiN_x$), silicon oxynitride ($SiO_xN_y$), germanium oxide ($GeO_x$), germanium nitride ($GeN_x$), germanium oxynitride ($GeO_xN_y$), silicon germanium oxide ($SiGe_xO_y$), silicon germanium nitride ($SiGe_xN_y$), silicon germanium oxynitride ($SiGe_xO_yN_z$), and the like.

A film including any of these insulating materials can be formed by a CVD method, a sputtering method, an ALD (atomic layer deposition) method, or the like. Alternatively, the film including any of these insulating materials can also be formed in such a manner that oxidation treatment, nitridation treatment, or oxynitridation treatment is performed on an upper surface of the semiconductor layer 13. As an example of oxidation treatment or nitridation treatment, a method in which an oxygen radical or a nitrogen radical generated in plasma is used is given. Alternatively, the upper surface of the semiconductor layer can be oxidized or nirtided by heat treatment in an atmosphere containing oxygen or an atmosphere containing nitrogen.

Oxynitride of a silicon semiconductor can be formed in such a manner that oxidation treatment is performed on the silicon semiconductor and then nitridation treatment is performed thereon. Further, oxidation treatment and nitridation treatment may be performed in the reverse order. In addition, the oxynitride can be formed also by oxynitridation treatment in which oxidation and nitridation are performed at the same time, such as heat treatment in an atmosphere containing dinitrogen monoxide ($N_2O$).

As another example of the deposition method of oxynitride of a silicon semiconductor, there is a plasma CVD method in which silane ($SiH_4$) and dinitrogen monoxide ($N_2O$) are used as main components. In the deposition method such as a CVD method, by adding an additive to a source gas, a film quality is easily controlled; thus, a film having desirable characteristics is easily formed. For example, by adding ammonia or hydrogen to a source gas, a film quality is changed, so that leakage current or dielectric breakdown strength can be controlled.

Note that a silicon oxynitride film means a film that contains more oxygen than nitrogen and, in the case where measurements are performed using Rutherford backscattering spectrometry (RBS) and hydrogen forward scattering (HFS), contains oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively.

Further, a silicon nitride oxide film refers to a film that contains more nitrogen than oxygen and, in the case where measurements are performed using RBS and HFS, contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The insulating layer 14 included in the intermediate layer 21 can be formed to a thickness of greater than or equal to 1 nm and less than or equal to 20 nm. The thickness is preferably greater than or equal to 1 nm and less than or equal to 15 nm. The reason of this is as follows: the larger the thickness of the insulating layer 14 is, the more current flowing between the first conductive layer 11 and the second conductive layer 12 can be suppressed; however, when the thickness is too large, writing voltage is increased.

Each of the first conductive layer 11 and the second conductive layer 12 is preferably formed of a conductive material which reacts with the semiconductor layer 13 to have lower resistance than a semiconductor which forms the semiconductor layer 13. For example, as a conductive material which reacts with silicon and germanium to generate a metal compound, there is a metal such as tungsten, titanium, nickel, chromium, molybdenum, tantalum, cobalt, zirconium, vanadium, palladium, hafnium, platinum, or iron. When such a metal reacts with silicon, silicide is formed. In addition, when such a metal reacts with germanium, germanide is formed.

As the material of the first conductive layer 11 and the second conductive layer 12, a compound or an alloy containing any of the above metals can be used as well as such a single metal. As the metal compound, there are silicide of the above-described metal such as tungsten silicide, metal nitride such as tantalum nitride or titanium nitride, and the like. In addition, as the alloy, there are a tantalum tungsten alloy, molybdenum tungsten, and the like. A film formed of any of the above-described conductive materials can be formed by a sputtering method, an evaporation method, a CVD method, or the like.

Alternatively, the first conductive layer 11 and the second conductive layer 12 can be formed of a material containing, as its main component, aluminum which reacts with silicon and germanium to form an alloy. As the material containing aluminum as its main component, there are aluminum containing another element such as silicon or copper, and an alloy of aluminum (e.g., aluminum tantalum or aluminum neodymium) in addition to pure aluminum. A film formed of any of the above conductive materials containing aluminum as its main component can be formed by a sputtering method, an evaporation method, a CVD method, or the like.

The first conductive layer 11 and the second conductive layer 12 can be formed of different conductive materials. Therefore, the first conductive layer 11 and the second conductive layer 12 can be formed of a variety of conductive materials, and a forming step of an electrode or a wiring of a semiconductor integrated circuit can serve as a forming step of the first conductive layer 11 and the second conductive layer 12.

Next, described is that writing voltage to the antifuse can be decreased by changing the film quality of the insulating layer 14 used as the intermediate layer. Here, the description is made using the antifuses having the structure shown in FIG. 1A as an example.

Table 1 is a film-formation condition table of silicon oxynitride which is used for the insulating layer 14 of the antifuse (conditions of the flow rates of gases). The insulating layer 14 was formed using plasma CVD with an RF frequency of 27.12 MHz under the following conditions: the distance between electrodes was 15 mm, the RF power density was 0.017 W/cm$^2$, the substrate temperature was 250° C., and the deposition pressure was 60 Pa.

TABLE 1

| | Flow rate of silane [sccm] | Flow rate of dinitrogen monoxide [sccm] | Flow rate of ammonia [sccm] | Proportion of flow rate of ammonia (flow rate of ammonia/ total flow rate) |
|---|---|---|---|---|
| Condition A | 6 | 6000 | 0 | 0.0% |
| Condition B | 6 | 6000 | 100 | 1.6% |
| Condition C | 6 | 6000 | 300 | 4.8% |
| Condition D | 6 | 6000 | 500 | 7.7% |
| Condition E | 6 | 6000 | 750 | 11.1% |

The first conductive layer 11 of the antifuse was a layer in which a 30-nm-thick tantalum nitride film and a 150-nm-thick tungsten film were stacked, and the second conductive layer 12 was a layer in which a 100-nm-thick titanium film, a 300-nm-thick aluminum film, an a 100-nm-thick titanium film were stacked. The intermediate layer 21 was formed using a 6-nm-thick silicon oxynitride film which corresponds to the insulating layer 14 and a 15-nm-thick amorphous silicon film which corresponds to the semiconductor layer 13. In addition, the element size was 2 μm square.

Figure 7A:
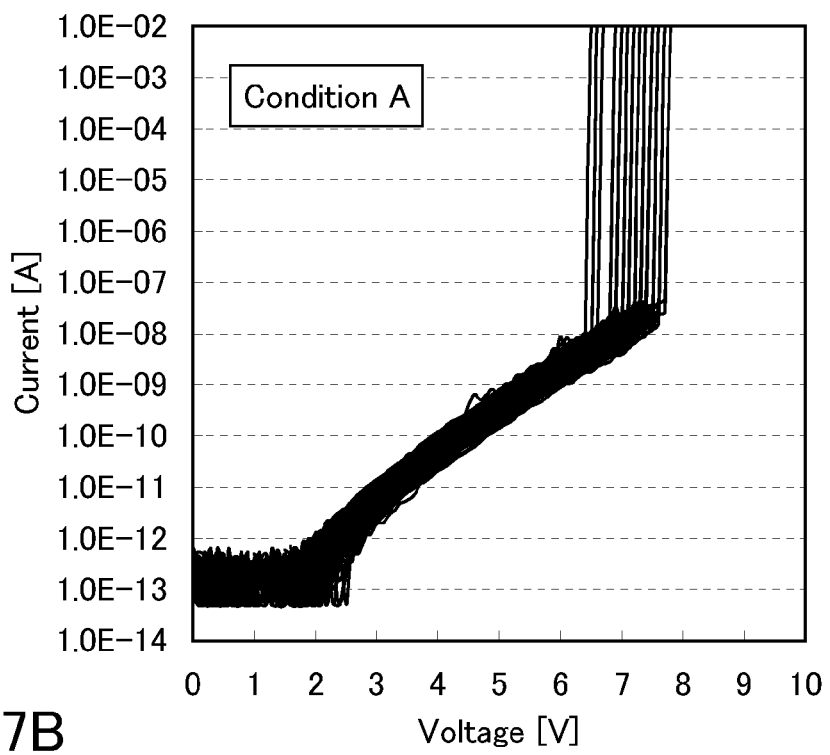
FIGS. 7A and 7B are each a graph showing current-voltage characteristics obtained when an antifuse is placed in a conductive state from a non-conductive state.
Figure 7B:
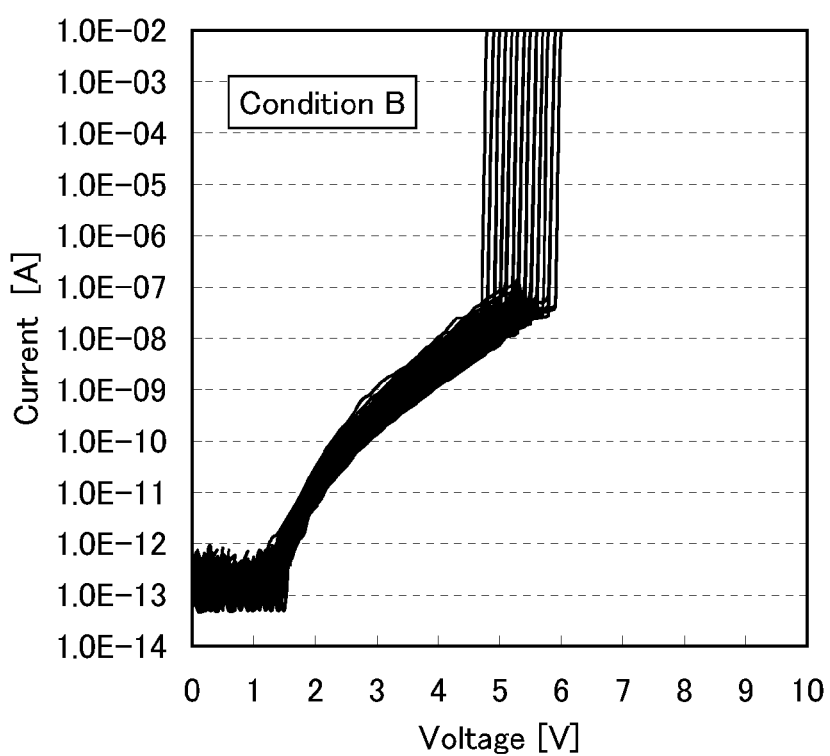

FIGS. 7A and 7B are graphs showing current-voltage characteristics obtained when the antifuse having the structure shown in FIG. 1A is placed in a conductive state from a non-conductive state. FIG. 7A shows measurement results of elements each including the insulating layer 14 manufactured under Condition A of Table 1, and FIG. 7B shows measurement results of elements each including the insulating layer 14 manufactured under Condition B of Table 1.

When characteristics of the elements each including the insulating layer 14 manufactured under Condition A and characteristics of the elements each including the insulating layer 14 manufactured under Condition B are compared, voltage values showing dielectric breakdown are different, and it is found that the elements manufactured under Condition B have a factor in writing at lower voltage. In other words, it is seen that ammonia which is included in the insulating layer 14 manufactured under Condition B or a constituent element of the insulating layer 14 has a function of enabling writing at low voltage.

Figure 8:
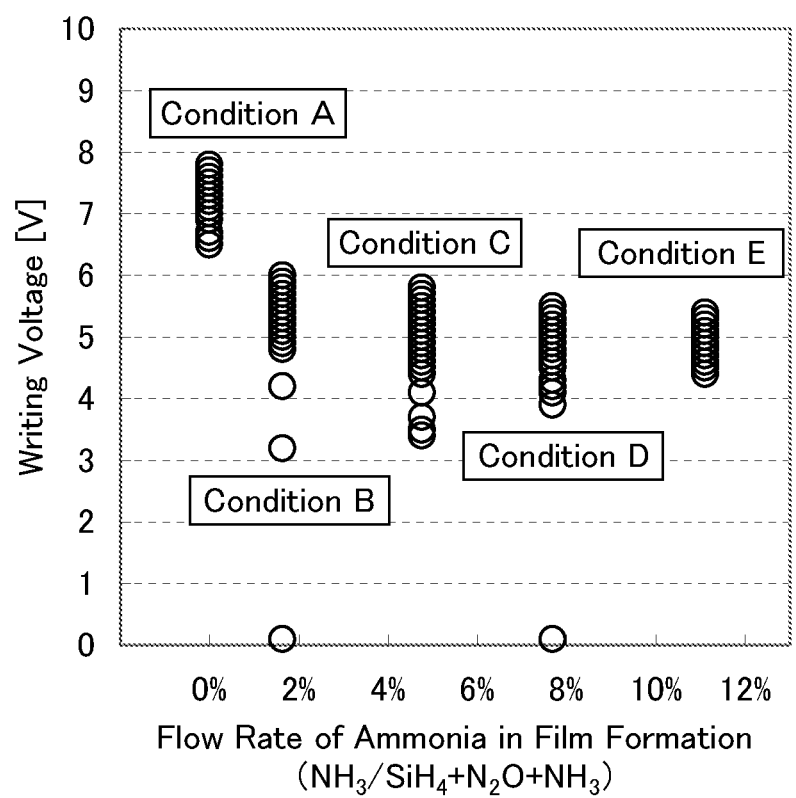
FIG. 8 is a graph showing a relation between the proportion of the flow rate of ammonia in film formation and writing voltage of an antifuse.

Electrical characteristics of the elements each including the insulating layer 14 manufactured under a condition where the additive amount of ammonia is increased are described. FIG. 8 shows current-voltage characteristics obtained when each element including the insulating layer 14 manufactured under Conditions A to E of Table 1 is placed in a conductive state from a non-conductive state. In FIG. 8, dielectric breakdown voltage is shown as writing voltage. Although a peculiar value is also shown, as a whole, writing voltage tends to be lower when the flow rate of ammonia in a source gas is high. Therefore, it is found that the insulating layers 14 manufactured under the Conditions B, C, D, and E where ammonia is contained have advantage in lowering the writing voltage over the insulating layer 14 manufactured under the Condition A where ammonia is not contained.

Note that the peculiar values seen under some conditions are caused by short circuited between an upper electrode and a lower electrode due to dust or void and do not directly show characteristics of film quality. When the additive amount of ammonia is increased more than that under the condition E, the film formation rate is significantly reduced, which is not preferable.

Constituent elements of ammonia are hydrogen and nitrogen. As an insulating layer having a high hydrogen concentration and/or a high nitrogen concentration, a silicon nitride film manufactured by a plasma CVD method is known and can be used for the antifuse. However, withstand voltage is relatively low and the antifuse using a silicon nitride film does not have sufficient reliability. On the other hand, a silicon oxide film manufactured by a plasma CVD method has higher withstand voltage than a silicon nitride film. However, the silicon oxide film needs high voltage to cause dielectric breakdown and a relatively large amount of current flows; thus, there is a problem in that power consumption in writing is increased.

Since desirable electrical characteristics cannot be obtained when the hydrogen concentration and/or the nitrogen concentration in the insulating layer 14 are/is too high or too low, it can be said that there is a preferable range of the hydrogen concentration and/or the nitrogen concentration. According to the results of the experiment by the present inventors, in the case where a silicon oxynitride film manufactured under the condition where the proportion of the flow rate of ammonia in the total flow rate of a source gas supplied to a plasma CVD apparatus in film formation is in a range of greater than or equal to 1.6% and less than or equal to 11.1%, data can be written at low voltage as compared with that in the case where a silicon oxynitride film to which ammonia is not added is used. In consideration of reproducibility of a step, film formation is preferably performed under the condition where the flow rate of ammonia is in a range of greater than or equal to 7.7% and less than or equal to 11.1%, in which change in characteristics by adding ammonia does not easily occur.

Figure 9A:
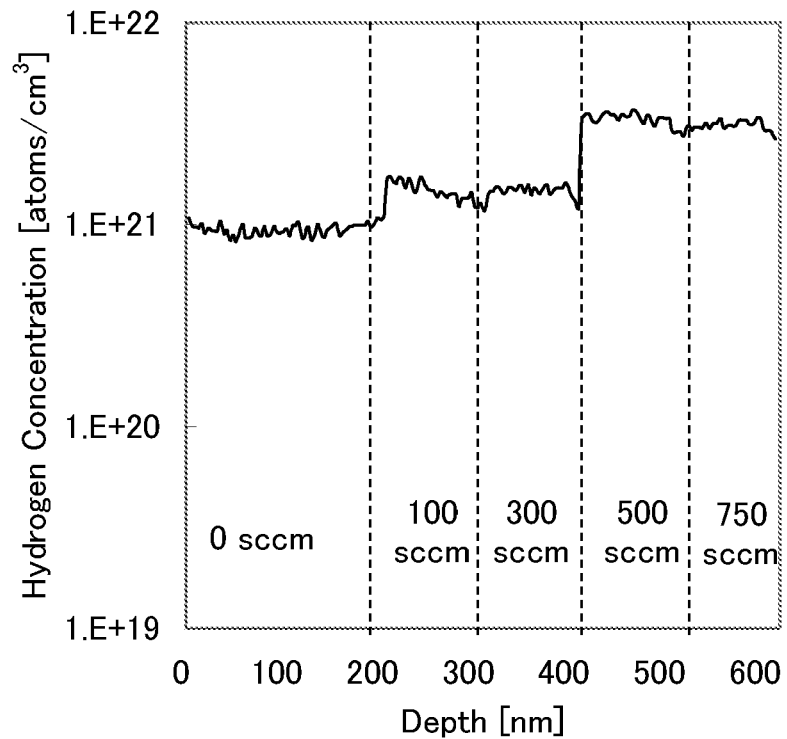
FIGS. 9A and 9B are each a SIMS analysis depth profile of a silicon oxynitride film.
Figure 9B:
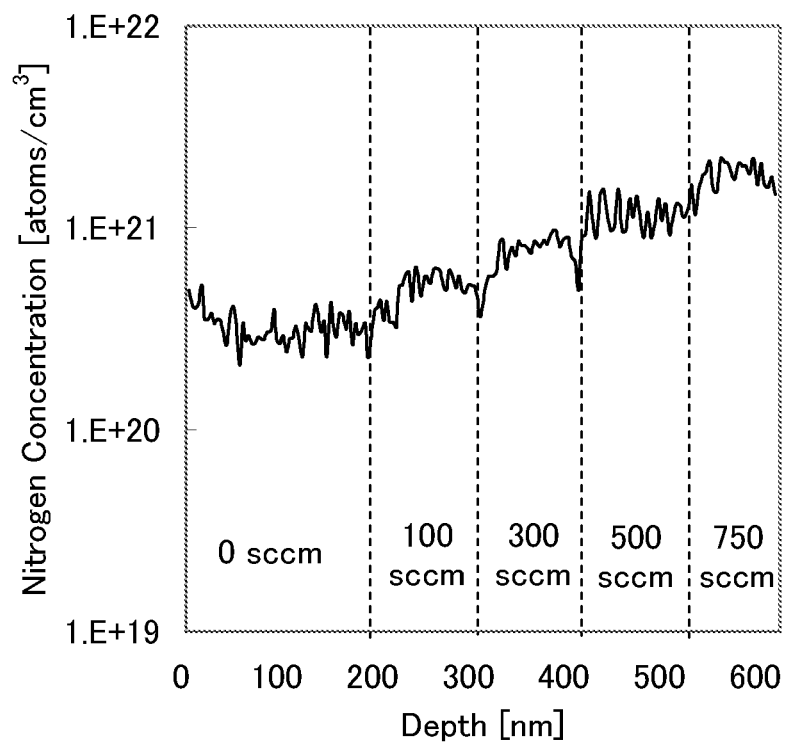

Next, results obtained by secondary ion mass spectrometry (SIMS) analysis to clarify the hydrogen concentration and the nitrogen concentration in the insulating layer 14 are described with reference to FIGS. 9A and 9B. FIG. 9A is a depth profile of the hydrogen concentration in the insulating layer 14 and FIG. 9B is a depth profile of the nitrogen concentration in the insulating layer 14. The vertical axis represents each concentration and the horizontal axis represents depth from the surface of the layer.

A sample used for the SIMS analysis is a stacked layer formed by successively performing film formation under the conditions shown in Table 1. The insulating layer 14 was formed to a thickness of 200 nm only under Condition A where ammonia was not added, which was a reference, and the insulating layers 14 were formed to a thickness of 100 nm under the other conditions. Since a surface of a film and an interface accompany inaccuracy due to influence of impurities as results of the SIMS analysis, the hydrogen concentration and the nitrogen concentration in a region excluding a region with 10% of the thickness of each layer from a surface of the layer and an interface are compared.

The amount of hydrogen and the amount of nitrogen in the film which can be seen from FIGS. 9A and 9B are increased as the additive amount of ammonia is increased. The hydrogen concentration and the nitrogen concentration in the insulating layers 14 each manufactured under Conditions B to E by which effects of reducing the writing voltages are confirmed are in a range from $1.2 \times 10^{21}$ atoms/cm$^3$ to $3.4 \times 10^{21}$ atoms/cm$^3$ and in a range from $3.2 \times 10^{20}$ atoms/cm$^3$ to $2.2 \times 10^{21}$ atoms/cm$^3$, respectively. It can be seen from these results that the insulating layer 14 containing hydrogen and/or nitrogen in the above ranges has an effect of reducing the writing voltage of the antifuse. Note that as shown in the graphs, the concentrations are not completely detected as constant values with respect to the depth directions of the layers. Therefore, a value range from the minimum value to the maximum value in the above thickness range is considered an effective concentration.

It is found from this embodiment that silicon oxynitride formed by adding ammonia (the insulating layer 14) has an effect of reducing the writing voltage of the antifuse. As a result, the degree of freedom for designing a boosting circuit and the like is increased, which can lead to reduction in chip size and reduction in power consumption.

This embodiment can be implemented in combination with any of the other embodiments or examples as appropriate.

(Embodiment 2)

In this embodiment, a structure of a semiconductor device which includes a memory portion including a plurality of memory cells each provided with an antifuse, transistors, and a driver circuit which is connected to the memory portion, and a manufacturing method of the semiconductor device will be described. The semiconductor device of this embodiment functions as a memory device and can be used as a PROM or a PLA (programmable logic array).

Figure 2:
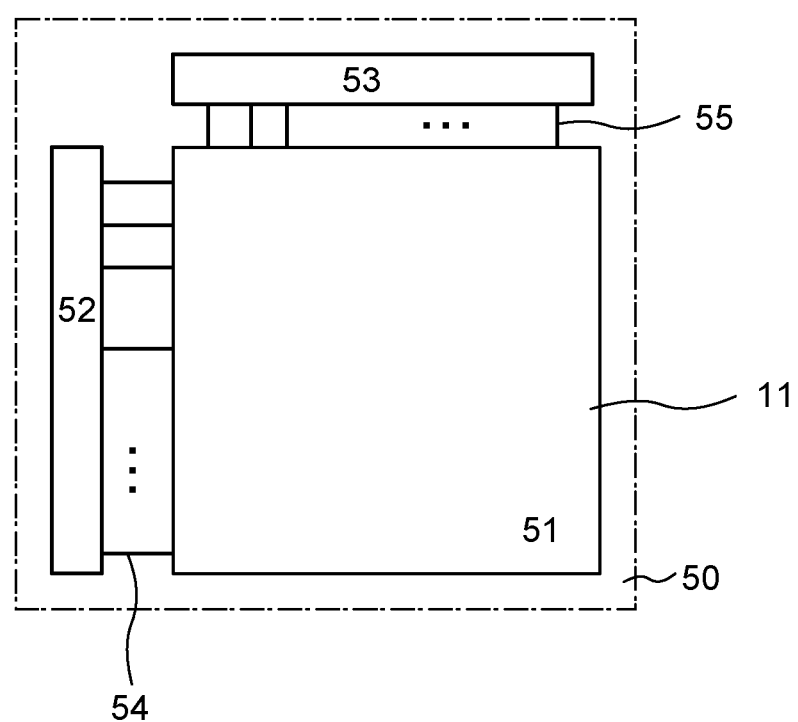
FIG. 2 is a block diagram illustrating a structural example of a semiconductor device.

FIG. 2 is a block diagram illustrating a structural example of the semiconductor device. A semiconductor device 50 includes a memory portion 51 including a plurality of memory cells and a semiconductor integrated circuit portion provided with a word line driver circuit 52 and a bit line driver circuit 53 which are electrically connected to the memory portion 51, and the like.

The memory portion 51 includes a plurality of word lines 54, and the word line driver circuit 52 is connected to the plurality of word lines 54. The word line driver circuit 52 includes a selector circuit and the like.

In addition, the memory portion 51 includes a plurality of bit lines 55, and the bit line driver circuit 53 is connected to the plurality of bit lines 55. The bit line driver circuit 53 includes a selector circuit, a reading circuit, a writing circuit, and the like. The bit line 55 connected to the memory cell to which data is written and from which data is read is selected by the selector circuit. The selected bit line 55 is connected to a writing circuit at the time of writing operation and connected to a reading circuit at the time of reading operation.

A voltage value applied to the plurality of word lines 54 is controlled by the word line driver circuit 52 and a voltage value applied to the plurality of bit lines 55 is controlled by the bit line driver circuit 53, whereby data is written to the memory cell in the memory portion 51 and the data of the memory cell is read out. That is, the word line driver circuit 52 and the bit line driver circuit 53 operate with each other, whereby data is written to the memory portion 51 and the data is read out from the memory portion 51.

Note that the structure of the semiconductor device 50 shown in FIG. 2 is an example, and the semiconductor device 50 may include another circuit such as a sense amplifier or a buffer as well as the memory portion 51, the word line driver circuit 52, and the bit line driver circuit 53.

Figure 3:
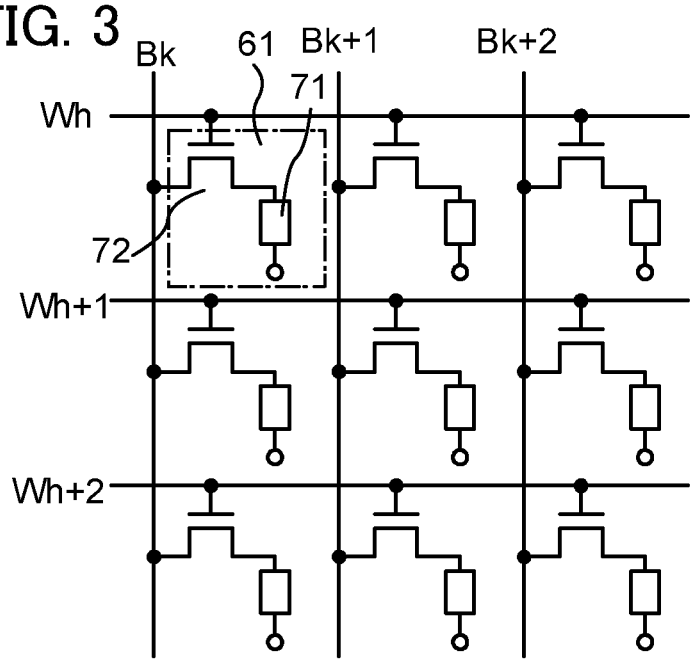
FIG. 3 is a circuit diagram illustrating a structural example of a memory portion of FIG. 2.
Figure 4:
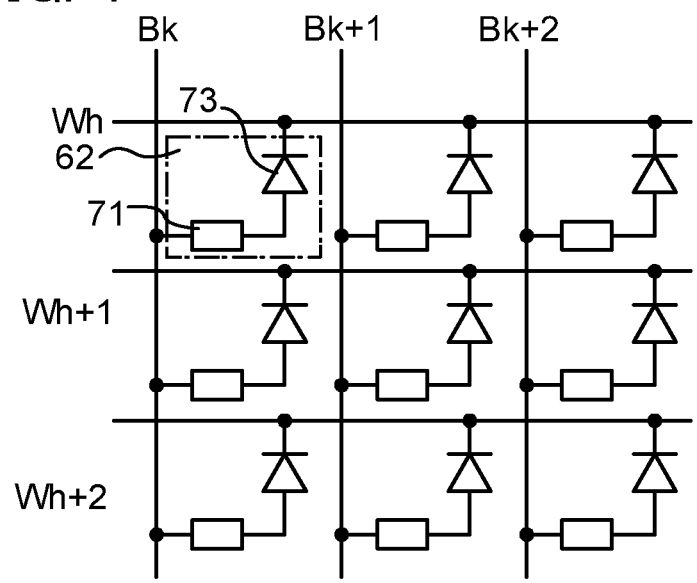
FIG. 4 is a circuit diagram illustrating a structural example of a memory portion of FIG. 2.
Figure 5:
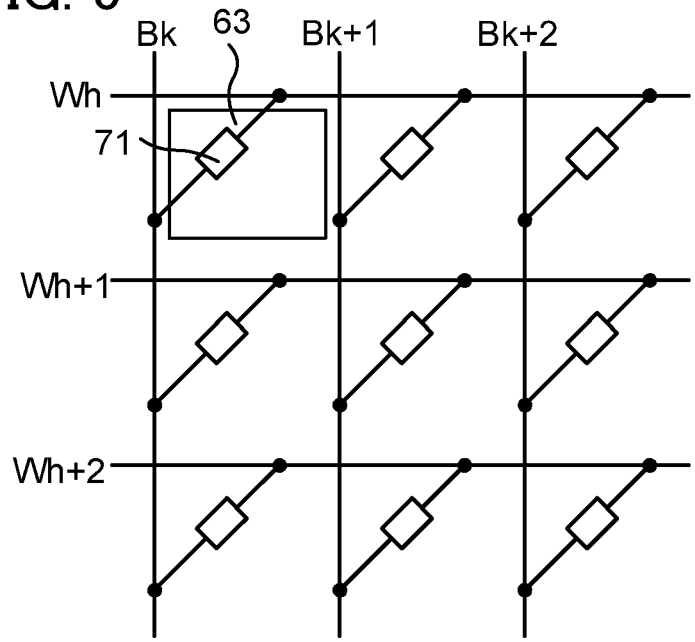
FIG. 5 is a circuit diagram illustrating a structural example of a memory portion of FIG. 2.

Next, an example of a circuit configuration of the memory portion 51 is described with reference to FIG. 3, FIG. 4, and FIG. 5. FIG. 3 and FIG. 4 are each a circuit diagram of a memory portion including active memory cells, and FIG. 5 is a circuit diagram of a memory portion including passive (simple matrix) memory cells. For convenience of explanation, nine memory cells are arranged in three rows and three columns as the memory portion 51 in FIG. 3, FIG. 4, and FIG. 5. In all FIG. 3, FIG. 4, and FIG. 5, in the memory portion, three bit lines Bk, Bk+1, and Bk+2 are provided corresponding to three word lines Wh, Wh+1, and Wh+2 and intersecting with the word lines Wh, Wh+1, and Wh+2.

In the case of the active memory cell shown in FIG. 3, each memory cell 61 includes an antifuse 71 as a memory element and a transistor 72 as a switching element. The transistor 72 may be either an n-type transistor or a p-type transistor.

For example, in a memory cell defined by the word line Wh and the bit line Bk, a gate of the transistor 72 is connected to the word line Wh, one of a source and a drain of the transistor 72 is connected to the bit line Bk, and the other of the source and the drain of the transistor 72 is connected to the antifuse 71.

In the case of the active memory cell shown in FIG. 4, each memory cell 62 includes the antifuse 71 as a memory element and a diode 73 as a switching element. The antifuse 71 and the diode 73 are connected in series. As the diode 73, a Schottky barrier diode, a PN junction diode, a PIN junction diode, a diode-connected transistor, or the like can also be used.

In the memory cell 62 defined by the word line Wh and the bit line Bk, one of electrodes of the antifuse 71 is connected to the bit line Bk, and one of electrodes of the diode 73 is connected to the word line Wh. Note that a circuit illustrated in FIG. 4 is an example of the case of using a diode as a switching element. In addition, contrary to FIG. 4, the diode 73 can be connected to the word line Wh so that current flows through the diode 73 from the word line Wh. Alternatively, the bit line and the word line of FIG. 4 may be switched, whereby the antifuse 71 can be connected to the word line Wh and the diode 73 can be connected to the bit line Bk.

In the case of the passive memory cell shown in FIG. 5, each memory cell 63 includes the antifuse 71 as a memory element. In the memory cell 63 defined by the word line Wh and the bit line Bk, one of electrodes of the antifuse 71 is connected to the word line Wh, and the other of the electrodes of the antifuse 71 is connected to the bit line Bk.

Figure 6:
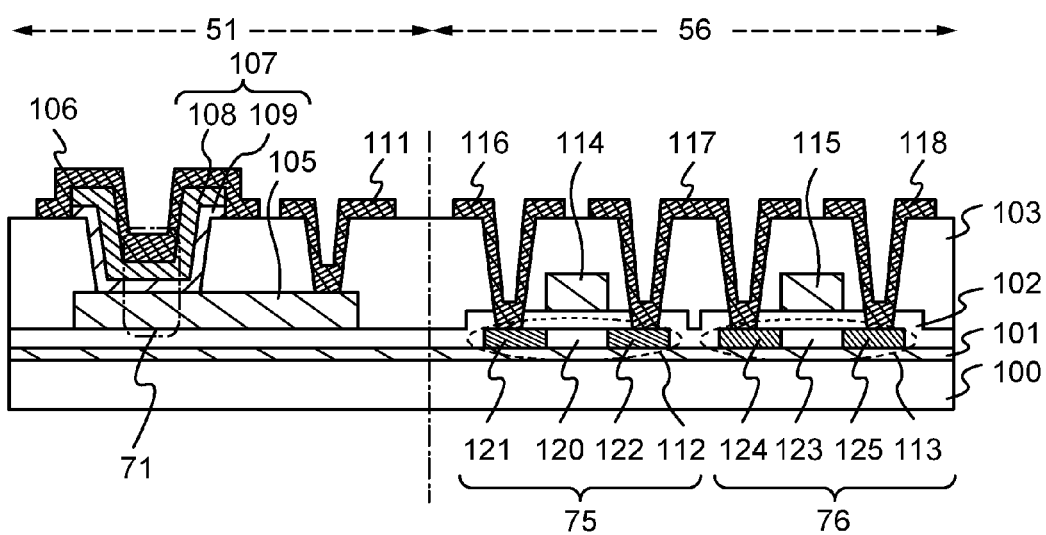
FIG. 6 is a cross-sectional view of a structural example of a semiconductor device of FIG. 2.

FIG. 6 is a cross-sectional view illustrating a structure of the semiconductor device 50. FIG. 6 shows a cross-sectional view of the semiconductor device 50 in which a thin film transistor forms a circuit, as an example. The antifuse 71 is shown as a typical example of a cross section of the memory portion 51 in FIG. 6. In addition, as a cross section of the word line driver circuit 52 or the bit line driver circuit 53 (in FIG. 6, these two circuits are collectively referred to as a driver circuit portion 56), a CMOS circuit including an n-channel transistor 75 and a p-channel transistor 76 is shown.

As illustrated in FIG. 6, the antifuse 71, the n-channel transistor 75, and the p-channel transistor 76 are formed over a substrate 100 with an insulating layer 101 interposed therebetween.

As the substrate 100, the following can be used, for example: a glass substrate, a quartz substrate, a sapphire substrate, a substrate made of an insulating material, such as a plastic substrate, or a conductive substrate such as a stainless steel substrate.

The antifuse 71 includes a first electrode 105, a second electrode 106, and an intermediate layer 107 between the first electrode 105 and the second electrode 106. In FIG. 6, the intermediate layer 107 has a two-layer structure in which an insulating layer 109 and a semiconductor layer 108 are stacked in this order.

The intermediate layer 107 is provided separately for each memory cell. An opening is formed for each memory cell in the insulating layer 103, and the intermediate layer 107 is in contact with the first electrode 105 in the opening. The insulating layer 103 is, in the memory portion 51, formed as a partition for dividing the intermediate layer 107 for each cell. Note that the insulating layer 103 functions as an interlayer insulating layer in the driver circuit portion 56.

In addition, the first electrode 105 of the antifuse 71 is connected to a third electrode 111 formed over the insulating layer 103. For example, in the case of the active memory cells illustrated in FIG. 3, the third electrode 111 can be formed as an electrode for electrically connecting the transistor which is the switching element to the first electrode 105.

In addition, in the case of the passive memory cell illustrated in FIG. 5, one of the first electrode 105 and the second electrode 106 is formed as a bit line and the other of the first electrode 105 and the second electrode 106 is formed as a word line. For that purpose, the first electrodes 105 and the second electrodes 106 are arranged in stripes. The first electrode 105 and the second electrode 106 are arranged so as to intersect with each other. In this case, the third electrode 111 does not have to be provided for each memory cell, and at least one third electrode 111 is formed for one first electrode 105 (one word line or one bit line), whereby the third electrode can serve as an extraction electrode.

The third electrode 111 is preferably formed using a conductive material having lower resistance than the first electrode 105. When the wirings such as the bit lines and the word lines are formed through the same steps as the third electrode 111 having low resistance, power consumption can be reduced.

The n-channel transistor 75 includes a semiconductor layer 112, an insulating layer 102 functioning as a gate insulating layer, a gate electrode 114, and electrodes 116 and 117, one of which functions as a source electrode and the other as a drain electrode. The semiconductor layer 112 includes a channel formation region 120 and n-type high-concentration impurity regions 121 and 122, one of which functions as a source region and the other as a drain region.

The p-channel transistor 76 includes a semiconductor layer 113, the insulating layer 102 functioning as a gate insulating layer, a gate electrode 115, and the electrode 117 and an electrode 118, one of which functions as a source electrode and the other as a drain electrode. The semiconductor layer 113 includes a channel formation region 123, and a p-type high-concentration impurity regions 124 and 125, one of which functions as a source region and the other as a drain region. In FIG. 6, the n-channel transistor 75 and the p-channel transistor 76 are connected to each other by the electrode 117 to form a CMOS circuit.

Next, a manufacturing method of the semiconductor device 50 having the cross-sectional structure illustrated in FIG. 6 is described. A method for forming the antifuse 71 in the steps of forming the n-channel transistor 75 and the p-channel transistor 76 is described here.

In the manufacturing method of this embodiment, the first electrode 105 of the antifuse 71 is formed through the same steps as the gate electrodes 114 and 115 of the transistors; therefore, the first electrode 105 is a conductive layer including the same material as the gate electrodes 114 and 115. Further, the second electrode 106 is formed through the same steps as the electrodes 116 to 118 each of which functions as a source electrode or a drain electrode of the transistor; therefore, the second electrode 106 is a conductive layer including the same material as the electrodes 116 to 118.

First, the insulating layer 101 is formed over the substrate 100. The insulating layer 101 can be formed using a single layer or a stacked layer with the use of materials selected from silicon oxide, silicon nitride, and silicon oxynitride. The insulating layer can be formed by a sputtering method, a CVD method, or the like.

Next, a crystalline semiconductor layer is formed over the insulating layer 101. The crystalline semiconductor layer can be formed in the following manner: an amorphous silicon film is formed by a sputtering method, an LPCVD method, a plasma CVD method, or the like, and a laser light irradiation step, a heat treatment step with a heating furnace, or the like is performed on the amorphous silicon film.

This crystalline semiconductor layer is processed into a predetermined shape by etching, whereby the semiconductor layers 112 and 113 are formed. The semiconductor layers 112 and 113 are formed using a crystalline semiconductor layer, so that the driving frequencies of the transistors of the driver circuit portion can be increased and data can be read from the memory portion 51 at high speed. Further, the driving voltages of the transistors of the driver circuit portion can be decreased and power consumption can be reduced.

Note that in order to control the threshold values of the transistors, an impurity element imparting p-type conductivity or n-type conductivity (boron or phosphorus) may be slightly added to the crystalline semiconductor layers.

Next, the insulating layer 102 is formed to cover the semiconductor layers 112 and 113. The insulating layer 102 can be formed of a similar material to the insulating layer 101. The insulating layer 102 is not limited to a single layer, and a stacked layer of different insulating materials may be used. The insulating layer 102 is formed to a thickness of greater than or equal to 1 nm and less than or equal to 200 nm by a plasma CVD method or a sputtering method. Alternatively, a method may be employed in which an insulating layer is formed to a thickness of greater than or equal to 10 nm and less than or equal to 50 nm by a plasma CVD method or a sputtering method and then surface nitridation treatment using microwave plasma is performed on the insulating layer.

Next, in the driver circuit portion 56, the gate electrodes 114 and 115 which respectively overlap with the semiconductor layers 112 and 113 are formed with the insulating layer 102 interposed therebetween. In the memory portion 51, the first electrode 105 is formed. The conductive layer which forms the first electrode 105 and the gate electrodes 114 and 115 is not limited to a single layer, and a stacked layer of different conductive materials may be used.

In the conductive layer which forms the first electrode 105 and the gate electrodes 114 and 115, a layer in contact with the intermediate layer 107 (a layer corresponding to the first conductive layer 11 of FIG. 1) is formed using a metal selected from titanium, tungsten, nickel, chromium, molybdenum, tantalum, cobalt, zirconium, vanadium, palladium, hafnium, platinum, and iron or an alloy or a compound thereof. Such a conductive layer reacts with the intermediate layer 107 to be an alloy, so that the antifuse 71 can be placed in a conductive state. The conductive layer can be formed by an evaporation method or a sputtering method.

It is preferable that a material having both characteristics suitable for an antifuse conductive layer and characteristics suitable for the gate electrodes of the transistors be selected for the conductive layer. As one of such materials, tungsten is given.

A tungsten film reacts with silicon to form tungsten silicide. In addition, the tungsten film reacts with germanium to form tungsten germanide. Therefore, the tungsten film is suitable for the conductive layer of the antifuse.

Next, a resist mask for covering a region to be included in the p-channel transistor 76 is formed and an impurity element imparting n-type conductivity is added to the semiconductor layer 112, whereby the n-type high-concentration impurity regions 121 and 122 are formed in a self-aligned manner. Then, in a region of the semiconductor layer, which overlaps with the gate electrode 114, the channel formation region 120 is formed. The impurity element imparting n-type conductivity may be added to the semiconductor layer 112 by an ion doping method or an ion implantation method. Phosphorus or arsenic is typically used as the impurity element imparting n-type conductivity.

After the resist mask for covering the region to be included in the p-channel transistor 76 is removed, another resist mask is formed to cover a region to be included in the n-channel transistor 75. Then, an impurity element imparting p-type conductivity (typically, boron) is added to the semiconductor layer 113. As a result, the p-type high-concentration impurity regions 124 and 125 are formed in the semiconductor layer 113 in a self-alignment manner, and a region which overlaps with the gate electrode 115 serves as a channel formation region 123.

Then, the resist mask is removed. Note that although an example in which the impurity element imparting n-type conductivity is added first is shown in this embodiment, the order of doping may be opposite to that. In addition, an impurity element imparting n-type or p-type conductivity is added after an insulator called a sidewall is formed on side walls of the gate electrode, whereby LDD (lightly doped drain) regions which are adjacent to the channel formation region can be formed.

Next, the impurity elements added to the semiconductor layers 112 and 113 are activated. The impurity elements are activated by high-temperature heat treatment in a furnace or heat treatment by irradiation with lamp light or laser light. Therefore, the first electrode 105 and the gate electrodes 114 and 115 are formed of a conductive layer which can withstand this heat treatment. Tungsten is a refractory metal and is a material which can withstand the heat treatment for activating the impurity elements.

Next, the insulating layer 103 is formed to cover the first electrode 105 and the gate electrodes 114 and 115. The insulating layer 103 functions as a partition for insulating antifuses 71 of adjacent memory cells. Thus, the insulating layer 103 is preferably formed of an insulating material which can withstand heat generated at the time of writing to the antifuse 71. For example, the insulating layer 103 can be formed using a single layer of an inorganic insulating material, such as a silicon oxide film, a silicon nitride film, or a silicon oxynitride film. Alternatively, a stacked layer of such inorganic insulating materials may be used. Further alternatively, a siloxane resin with high heat resistance may be used for one layer of the insulating layer 103. A film of a siloxane resin can be easily formed by a coating method.

Next, a resist mask is formed and the insulating layer 103 is etched, whereby an opening reaching the first electrode 105 is formed. The etching may be performed by wet etching, dry etching, or a combination thereof. After that, the resist mask is removed and the intermediate layer 107 is formed to cover the opening.

The size of the opening is preferably greater than or equal to 0.1 µm² and less than or equal to 30 µm². The size of the antifuse 71 is determined depending on the size of the opening. Note that there is no particular limitation on the shape of the opening, and the opening may be any of circular, elliptical, and rectangular.

Next, the intermediate layer 107 of the antifuse 71 is formed. The above-described formation steps of the opening and the intermediate layer 107 are steps unique to the antifuse 71 and added to the manufacturing process of the transistors. A formation method of the intermediate layer 107 is described here by taking the case where a silicon oxynitride film is formed as the insulating layer 109 of the intermediate layer and an amorphous silicon film is formed as the semiconductor layer 108, as an example.

First, a silicon oxynitride film and an amorphous silicon film are stacked over the insulating layer 103. Here, a silicon oxynitride film is formed by the method described in Embodiment 1, whereby an antifuse capable of writing at low voltage can be obtained. By changing a source gas introduced into one reaction chamber of a plasma CVD apparatus, these films can be successively formed without taking out the substrate from the reaction chamber. The same can be said for the case where silicon oxide or silicon nitride is used instead of silicon oxynitride. Note that a silicon oxynitride film and an amorphous silicon film may be formed in different reaction chambers using a plasma CVD apparatus which includes a plurality of reaction chambers.

The stacked layer formed of the silicon oxynitride film and the amorphous silicon film is etched, whereby the intermediate layer 107 with a predetermined shape is formed. That is, for forming the intermediate layer 107, the following steps are performed separately from the manufacturing process of the transistors: a step of forming the films which form the intermediate layer 107, a photolithography step for forming a resist mask, and a step of etching the formed films.

Next, a resist mask is formed and the insulating layers 102 and 103 are etched, whereby openings are formed. The etching may be performed by wet etching, dry etching, or a combination thereof. Then, the resist mask is removed. The openings which are formed in this step are three kinds of contact holes: contact holes reaching the n-type high-concentration impurity regions 121 and 122 and the p-type high-concentration impurity regions 124 and 125, contact holes reaching the gate electrodes 114 and 115 of the transistors (not illustrated), and a contact hole reaching the first electrode 105.

Note that these contact holes can be formed at the same time as the formation of the opening for forming the intermediate layer 107 provided in the insulating layer 103. In this case, etching conditions for forming the intermediate layer 107 are adjusted so that the semiconductor layers 112 and 113 and the gate electrodes 114 and 115 are not etched too much.

Next, a conductive layer having a single-layer structure or a stacked-layer structure is formed by a sputtering method. Resist masks with shapes of a variety of electrodes are formed over the conductive layer to etch the conductive layer, whereby the second electrode 106 and the third electrode 111 are formed in the memory portion 51. In addition, the electrodes 116 to 118 are formed in the driver circuit portion 56.

In this manner, the second electrode 106 of the antifuse 71 can be formed in the same steps as the electrodes 116 to 118, each of which functions as the source electrode or the drain electrode of the transistor.

A conductive material which reacts with a semiconductor such as silicon or germanium and forms a compound having lower resistance than the semiconductor is used for the conductive layer used as the second electrode 106, the third electrode 111, and the electrodes 116 to 118. As such a conductive material, the following metal can be used: tungsten, titanium, nickel, chromium, molybdenum, tantalum, cobalt, zirconium, vanadium, palladium, hafnium, platinum, iron, or the like. An alloy or a compound of the metal can also be used as such a conductive material.

For example, the conductive layer which forms the second electrode 106, the third electrode 111, and the electrodes 116 to 118 can be formed using a film having a three-layer structure: a titanium film with a thickness of greater than or equal to 50 nm and less than or equal to 200 nm, a film which contains aluminum as its main component with a thickness of greater than or equal to 100 nm and less than or equal to 400 nm (e.g., a pure aluminum film), and a titanium film with a thickness of greater than or equal to 50 nm and less than or equal to 200 nm are stacked. The titanium film is formed as the lowest layer, so that the amorphous silicon of the intermediate layer 107 reacts with titanium at the time of writing and titanium silicide with low resistance can be formed.

In this conductive layer having a three-layer structure, the titanium film is used for the lowest layer and the uppermost layer; therefore, a contact resistance with other conductive materials and semiconductor materials can be reduced. Since a film containing aluminum with lower resistance than a film containing titanium or tungsten is used as the intermediate layer, the conductive layer having a three-layer structure is preferably used as an extraction wiring used in the driver circuit portion 56, the third electrode 111 in the memory portion, or the like.

Through the above-described steps, the memory portion 51 including the antifuse as the memory element and the driver circuit portion 56 including the transistors can be manufactured over the same substrate. In addition, the intermediate layer having the stacked-layer structure which is described in Embodiment 1 is applied to the intermediate layer 107 of the antifuse 71, whereby the antifuse 71 can be manufactured as well as the transistors without making the manufacturing process complicated.

Further, a semiconductor integrated circuit portion such as a driver circuit portion, a power supply circuit portion, or a logic circuit portion and an antenna portion are provided in addition to the memory element described in this embodiment, so that a semiconductor device provided with a memory, which has a function of transmitting/receiving a signal to/from an external device with wireless communication, can be manufactured.

Although an example where transistors are formed over a glass substrate using a thin film semiconductor is described in this embodiment, the transistors may be formed using a single crystal semiconductor substrate. In that case, a single crystal silicon substrate, a single crystal germanium substrate, an SOI substrate, or the like can be used as the substrate.

This embodiment can be implemented in combination with any of the other embodiments or examples as appropriate.

(Embodiment 3)

In this embodiment, a manufacturing method of a semiconductor device in which a semiconductor integrated circuit including an antifuse is separated from a manufacturing substrate and is sandwiched between flexible insulators is described. Note that the semiconductor device of this embodiment is a non-contact signal processor having a function of transmitting/receiving a signal to/from an external device with wireless communication.

Figure 17:
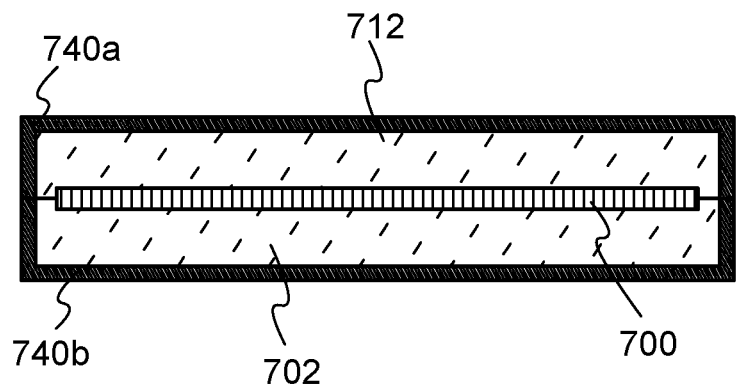
FIG. 17 is a cross-sectional view illustrating a semiconductor device.

A semiconductor device of this embodiment is illustrated in FIG. 17. In this embodiment, an element layer 700 includes a memory portion, a semiconductor integrated circuit portion, and an antenna portion and is sandwiched between a first insulator 712 and a second insulator 702 which are flexible. The memory portion 51 using the antifuse as the memory element (see FIG. 2), which is described in Embodiment 2, can be used here as the memory portion.

By directly bonding the first insulator 712 and the second insulator 702 to a periphery of the element layer 700, the periphery of the element layer 700 has a high sealing property. In order to form such a structure, the first insulator 712 and the second insulator 702 may be fused and bonded by heat generated when the periphery of the element layer 700 is cut with a laser or the like, for example.

For the first insulator 712 and the second insulator 702, a structure body in which a fibrous body is impregnated with an organic resin can be used. An example of using the structure body is illustrated in FIGS. 18A and 18B.

Figure 18A:
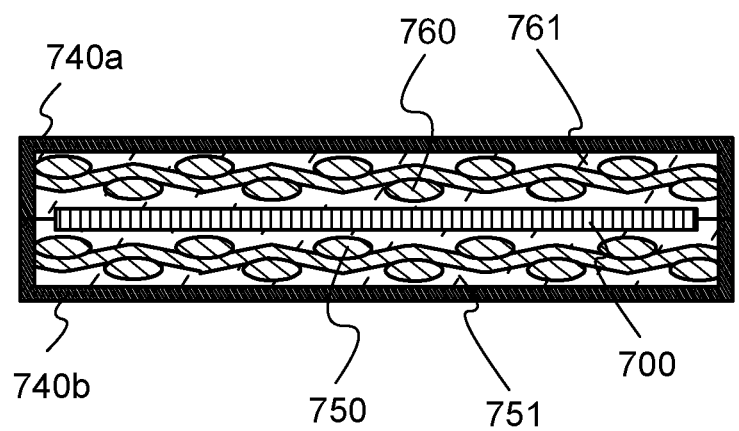
FIGS. 18A and 18B are a cross-sectional view and a plan view illustrating a structure body in which a semiconductor integrated circuit is sandwiched.
Figure 18B:
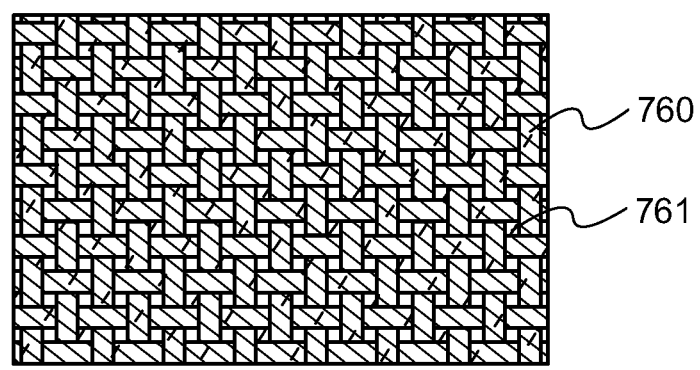

As illustrated in FIG. 18A, fibrous bodies 750 and 760 are impregnated with organic resins 751 and 761 to form the structure body. FIG. 18B is a plan view of the fibrous body 760 which is a woven fabric formed using yarn bundles of fibers for the warp yarn and the weft yarn. The fibrous body 760 is woven using warp yarns spaced at regular intervals and weft yarns spaced at regular intervals. In the fibrous body 760, the fibrous body is more easily impregnated with the organic resin 761, whereby the adhesiveness between the fibrous body 760 and the element layer 700 can be increased.

The structure body is also called a prepreg. The prepreg is obtained in such a manner that a fibrous body is impregnated with a matrix resin which is diluted with an organic solvent, and then the organic solvent is volatilized so that the matrix resin is semi-cured. The thickness of the structure body is preferably greater than or equal to 10 μm and less than or equal to 100 μm, more preferably, greater than or equal to 10 μm and less than or equal to 30 μm. By using the structure body as an insulator to be a supporter, a thin semiconductor device capable of being curved can be manufactured. The structure body preferably has a modulus of elasticity of greater than or equal to 13 GPa and less than or equal to 15 GPa and a modulus of rupture of greater than or equal to 140 MPa.

Note that a plurality of structure bodies may be stacked. In this case, the plurality of structure bodies is stacked so that directions of fibers included in the structure bodies which are stacked may be aligned; however, when the plurality of structure bodies is stacked so that the directions of the fibers are different from each other, the strength of the whole structure body can be improved.

As the organic resin 761, a thermosetting resin such as an epoxy resin, an unsaturated polyester resin, a polyimide resin, a bismaleimide-triazine resin, or a cyanate resin; or a thermoplastic resin such as a polyphenylene oxide resin, a polyetherimide resin, or a fluorine resin can be used. Furthermore, a plurality of resins selected from the above-described thermosetting resins and thermoplastic resins may be used. The higher the glass transition temperature of the organic resin 761 is, the less the organic resin 761 is broken by local pressing force, which is preferable.

Alternatively, a material with a low modulus of elasticity and a high breaking strength may be used for the organic resin 761. For example, a film having rubber elasticity with a modulus of elasticity of greater than or equal to 5 GPa and less than or equal to 12 GPa and a modulus of rupture of greater than or equal to 300 MPa can be used. When the first insulator 712 and the second insulator 702 which are formed using a high-strength material having elasticity are provided, burden such as local pressing force can be diffused in the entire layer and absorbed; accordingly, the semiconductor device can be prevented from being damaged. As such a material, an aramid resin, a polyethylene terephthalate (PET) resin, a polyethylene naphthalate (PEN) resin, a polyether sulfone (PES) resin, a polyphenylene sulfide (PPS) resin, a polyimide (PI) resin, or the like can be used.

Highly thermally-conductive filler may be dispersed in the organic resin 761 or yarn bundles of fibers. As the highly thermally-conductive filler, a compound such as aluminum nitride, boron nitride, silicon nitride, or alumina and a metal particle such as silver or copper can be given. When the highly thermally-conductive filler is included in the organic resin or the yarn bundles of fibers, heat generated in the element layer 700 can be easily released to the outside. Accordingly, thermal storage in the semiconductor device can be suppressed and thus degradation of characteristics of the semiconductor device can be reduced.

The fibrous body 760 is a woven or nonwoven fabric using high-strength fibers of an organic compound or an inorganic compound. A high-strength fiber is a fiber with a high modulus of elasticity in tension or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, and a carbon fiber can be given. As the glass fiber, a glass fiber using E glass, S glass, D glass, Q glass, or the like can be used. Note that the fibrous body 760 may be formed using a plurality of fibers selected from the above high-strength fibers.

The fibrous body 760 may be a woven fabric which is woven using bundles of fibers (single yarns) (hereinafter the bundles of fibers are referred to as yarn bundles) for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A bundle of fibers which is subjected to fiber opening has a large width because its cross section becomes a rectangular shape or a flat shape, which can lead to reduction of the number of single yarns in the thickness direction. Further, with the use of a loosely twisted yarn as the yarn bundle of fibers, the yarn bundle is easily flattened. The use of a yarn bundle having an elliptical shape or a flat shape in cross section in this manner can reduce the thickness of the fibrous body 760. Thus, the thickness of the above-described structure body which is formed by impregnating with an organic resin can be reduced, and a thin semiconductor device can be manufactured.

In the drawings of this embodiment, the fibrous body 760 is shown as a woven fabric which is plain-woven using a yarn bundle having an elliptical shape in cross section.

Further, in order to enhance permeability of an organic resin into the inside of the yarn bundle of fibers, the fiber may be subjected to a surface treatment. For example, as the surface treatment, plasma discharge treatment such as corona discharge treatment for activating a surface of the fiber can be performed. Further, surface treatment using a silane coupling agent or a titanate coupling agent may be performed.

The first insulator 712 and the second insulator 702 may be bonded to the element layer 700 using a bonding layer. The bonding layer is acceptable as long as it can bond the first insulator 712 and the second insulator 702 to the element layer 700, and a thermosetting resin, an ultraviolet curable resin, an acrylic resin, a urethane resin, an epoxy resin, a silicone resin, or the like can be used. The thickness of the bonding layer may be approximately 3 μm to 15 μm. In the case where the first insulator 712 and the second insulator 702 are bonded to the element layer 700 by heat treatment and pressure treatment, the bonding layer is not necessarily used.

Alternatively, as illustrated in FIG. 17, the insulator may be covered by a conductive shield. The conductive shields 740a and 740b are provided so as not to interfere with electromagnetic waves that should be sent and received by the antenna portion included in the element layer 700, and to block static electricity applied from the outside to the element layer 700 in the semiconductor device. The conductive shields 740a and 740b diffuse and dissipate static electricity applied by electrostatic discharge or prevent local electric charges (localization of electric charges) (prevents local potential difference) so that an electrostatic breakdown of the element layer 700 can be prevented.

There are no particular limitations on the conductive shields 740a and 740b as long as they are conductive, and a conductive layer formed using a conductive material can be used.

For the conductive shields 740a and 740b, a single layer of a metal film, a metal nitride film, a metal oxide film, or the like; or a stack of any of these films can be used. The conductive shields 740a and 740b may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material which contains any of the above elements as a main component.

As the nitride material, tantalum nitride, titanium nitride, or the like can be used. As the oxide material, it is possible to use indium tin oxide (ITO), indium tin oxide containing silicon oxide (ITSO), organoindium, organotin, zinc oxide, zinc oxide containing indium (IZO), zinc oxide containing gallium (GZO), tin oxide (SnO$_2$), indium oxide containing tungsten oxide, indium zinc oxide containing tungsten oxide, indium oxide containing titanium oxide, indium tin oxide containing titanium oxide, or the like.

Alternatively, a semiconductor film formed of a semiconductor doped with an impurity element or the like to have conductivity or the like can be used. For example, a polycrystalline silicon film doped with an impurity element such as phosphorus, or the like can be used.

Further alternatively, a conductive high molecule (also referred to as a conductive polymer) may be used as the conductive shields 740a and 740b. As the conductive high molecule, a so-called π-electron conjugated conductive polymer can be used. For example, polyaniline and/or a derivative thereof, polypyrrole and/or a derivative thereof, polythiophene and/or a derivative thereof, and a copolymer of two or more of aniline, pyrrole, and thiophene and/or a derivative thereof can be given.

Specific examples of a conjugated conductive high-molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

An organic resin or a dopant (a halogen, a Lewis acid, an inorganic acid, an organic acid, a transition metal halide, an organic cyano compound, a nonionic surfactant, and the like) may be contained in the conductive shields 740a and 740b formed using a material containing a conductive high molecule.

The conductive shields 740a and 740b can be formed by a dry process such as a sputtering method, a plasma CVD method, or an evaporation method, or a wet process such as a coating method, a printing method, or a droplet discharge method (inkjet method).

Although not illustrated, a protective layer may be stacked on each of the conductive shields 740a and 740b. For example, titanium films (with each thickness of approximately 5 nm to 100 nm) are formed as the conductive shields 740a and 740b, and then titanium oxide films may be stacked as the protective layers on the titanium films. By providing the protective layers, deterioration of the conductive shields 740a and 740b can be suppressed. The protective layer may have a thickness of approximately 10 nm to 200 nm.

Next, a manufacturing method of a semiconductor device in one embodiment of the present invention is described with reference to FIGS. 19A to 19D.

Figure 19A:
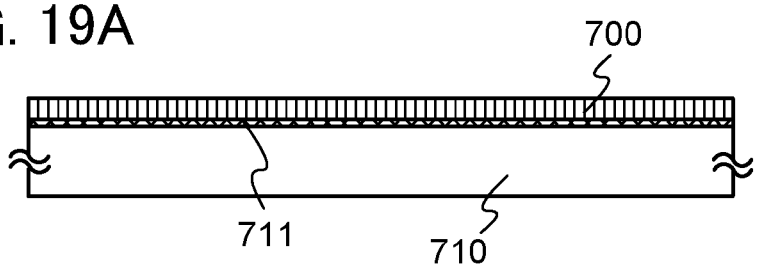
FIGS. 19A to 19D are cross-sectional views illustrating a manufacturing method of a semiconductor device.
Figure 19B:
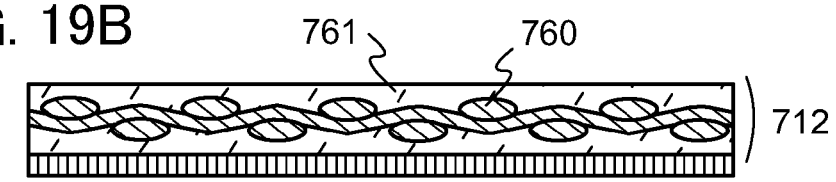
Figure 19C:
Figure 19D:
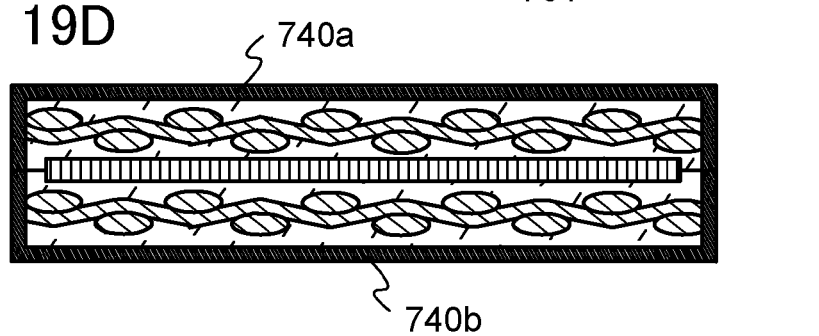
Figure 20A:
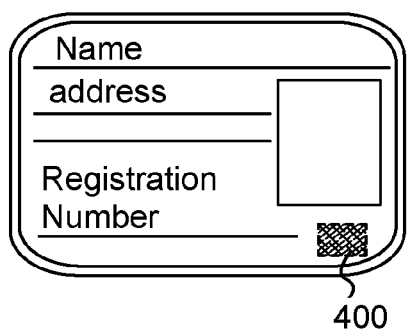
FIGS. 20A to 20F are external views of articles each including a semiconductor device capable of non-contact data transmission.
Figure 20B:
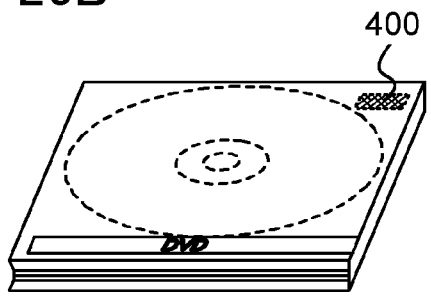
Figure 20C:
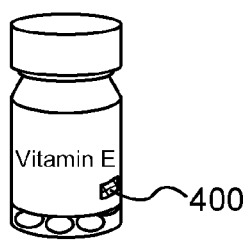
Figure 20D:
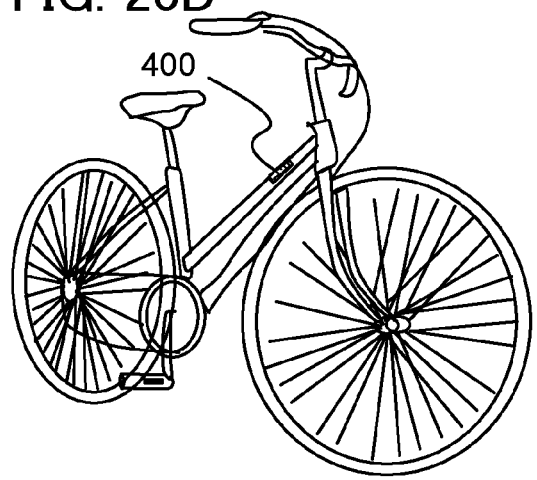
Figure 20E:
Figure 20F:
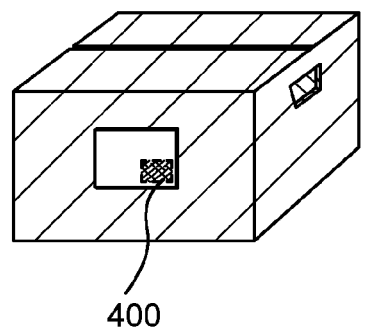

First, the element layer 700 is formed over a substrate 710 having an insulating surface with a separation layer 711 interposed therebetween (see FIG. 19A).

As the substrate 710 having an insulating surface, a glass substrate, a quartz substrate, a sapphire substrate, a ceramic substrate, a metal substrate having an insulating layer formed on its surface, or the like can be used. Alternatively, a plastic substrate which can withstand the process temperature of this embodiment may be used. The substrate can be selected as appropriate in accordance with the manufacturing process of a semiconductor device.

For the separation layer 711, an element selected from tungsten, molybdenum, titanium, tantalum, niobium, nickel, cobalt, zirconium, zinc, ruthenium, rhodium, palladium, osmium, iridium, and silicon, or an alloy material or a compound material containing such an element as a main component can be used. The separation layer 711 is not limited to a single-layer structure and a stacked-layer structure may be employed. Further, the separation layer 711 can be formed by a sputtering method, a plasma CVD method, a coating method, a printing method, or the like. The coating method here includes a spin coating method, a droplet discharge method, a dispensing method, and the like.

When the separation layer 711 has a single-layer structure, it is preferable to use a tungsten layer, a molybdenum layer, or a layer containing a mixture of tungsten or molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum can be used. Note that the mixture of tungsten and molybdenum corresponds to an alloy of tungsten and molybdenum, for example.

When the separation layer 711 has a stacked-layer structure, a tungsten layer, a molybdenum layer, or a layer containing a mixture of tungsten and molybdenum is preferably formed as a first layer. An oxide layer, a nitride layer, an oxynitride layer, or a nitride oxide layer of the first layer is preferably formed as a second layer.

For example, in the case where a tungsten layer is used as the first layer of the separation layer 711 having a stacked-layer structure, an insulating layer such as an oxide layer is formed over the tungsten layer and a layer containing an oxide of tungsten generated at the interface can be used as the second layer of the separation layer 711.

Alternatively, as the second layer of the separation layer 711, a layer containing an oxide of tungsten formed by performing thermal oxidation treatment, oxygen plasma treatment, treatment with a highly oxidizing solution such as ozone water, or the like on the surface of the tungsten layer which is the first layer of the separation layer 711 having a stacked-layer structure may be used. Here, the plasma treatment or the thermal oxidation treatment may be performed in an atmosphere of oxygen, nitrogen, dinitrogen monoxide, or a mixed gas of any of these gases. This also applies to the case where a layer containing nitride, oxynitride, or nitride oxide of tungsten is formed. By forming a silicon nitride film, a silicon oxynitride film, or a silicon nitride oxide film over the layer containing tugsten, a layer containing the above nitride, oxynitride, or nitrogen oxide can be formed.

Although the separation layer 711 is formed over the substrate 710 in the above step, one embodiment of the present invention is not limited to the above step. An insulating layer which serves as a base may be formed over the substrate 710, and the separation layer 711 may be provided over the insulating layer.

Next, the element layer 700 and the first insulator 712 in which the fibrous body is impregnated with the organic resin are bonded to each other, and the element layer 700 is separated from the substrate 710 using the separation layer 711 as a border. The element layer 700 is transferred to the first insulator 712 side here (see FIG. 19B).

In this embodiment, the structure body in which the fibrous body 760 is impregnated with the organic resin 761 is used as the first insulator 712. The organic resin included in the structure body is cured in close contact with the element layer 700 by application of heat and pressure. Note that in the case where the organic resin is an organic plastic resin, the organic resin is plasticized and then cured in a later cooling step. The step in which the structure body is subjected to pressure bonding is performed under an atmospheric pressure or a reduced pressure.

Note that as another transferring step, the following method can be used. A separation layer is formed between a substrate and the element layer 700; a metal oxide film is provided between the separation layer and the element layer 700; and the metal oxide film is weakened by crystallization, so that the element layer 700 is separated from the substrate.

Alternatively, a method can be used in which an amorphous silicon film containing hydrogen is provided between a substrate with high heat resistance and the element layer 700, and the amorphous silicon film is removed by laser light irradiation or etching, whereby the element layer 700 is separated from the substrate.

Further alternatively, a method can be used in which a separation layer is formed between a substrate and the element layer 700, a metal oxide film is provided between the separation layer and the element layer 700, the metal oxide film is weakened by crystallization, part of the separation layer is removed by etching, and then the element layer 700 is separated from the substrate using the weakened metal oxide film as a border.

Still further alternatively, a method may be used in which a substrate over which the element layer 700 is formed is eliminated mechanically or removed by etching. Alternatively, it is possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with laser light so that nitrogen, oxygen, or hydrogen contained in the separation layer is discharged as a gas, whereby separation of the element layer 700 from a substrate having an insulating surface is promoted.

By combining the above-described separation methods, the transferring step can be more easily performed. Alternatively, the element layer 700 may be separated from the substrate having an insulating surface while a liquid is placed at an interface between the separation layer and the element layer 700.

A structure body in which the fibrous body 750 is impregnated with the organic resin 751 is used as the second insulator 702. The second insulator 702 is heated and subjected to pressure bonding so that the structure body is bonded to a separation surface where the element layer 700 is exposed. Thus, the element layer 700 is sandwiched between the first insulator 712 and the second insulator 702 which faces to the first insulator 712 (see FIG. 19C).

Note that the same material as the fibrous body 760 can be used for the fibrous body 750. In addition, the same material as the organic resin 761 can be used for the organic resin 751.

Although not illustrated, a plurality of element layers 700 arranged in the plane direction is sandwiched between the first insulator 712 and the second insulator 702. Therefore, in order to complete a semiconductor device, the semiconductor integrated circuits need to be divided into regions each including one element layer 700. There is no particular limitation on the dividing method, and dividing is performed by laser light irradiation in this embodiment.

By dividing with the laser light irradiation, the first insulator 712 and the second insulator 702 are melted, diffused and bonded to each other at a divided surface. Accordingly, the element layer 700 is sealed by the first insulator 712 and the second insulator 702.

In the case where a conductive shield is provided, the conductive shields 740a and 740b are formed so as to cover the first insulator 712 and the second insulator 702. First, the conductive shield 740a is formed on the surface and the divided surface of the first insulator 712, and then the conductive shield 740b is formed on the surface and the divided surface of the second insulator 702 (see FIG. 19D). The conductive shields 740a and 740b each preferably have a thickness of greater than 0 µm and less than or equal to 1 µm, more preferably greater than or equal to 5 nm and less than or equal to 100 nm. In this embodiment, as the conductive shields 740a and 740b, a titanium film with a thickness of 10 nm is formed by a sputtering method.

In such a manner, the element layer 700 is sealed by the first insulator 712 and the second insulator 702. Further, the element layer 700 is protected against electrostatic discharge by the conductive shields 740a and 740b which are formed over the insulators.

This embodiment can be implemented in combination with any of the other embodiments or examples as appropriate.

EXAMPLE 1

In this example, a manufacturing method of a semiconductor device including an antifuse OTP (one time programmable) memory is described with reference to FIGS. 10A to 10E, FIGS. 11A to 11E, FIGS. 12A to 12E, FIGS. 13A to 13D, and FIGS. 14A to 14C. An example of manufacturing a semiconductor device in which a logic circuit portion 1550, a semiconductor memory circuit portion 1552, and an antenna portion 1554 are provided over the same substrate, is described here.

Circuits including thin film transistors are integrated in the logic circuit portion 1550. The semiconductor memory circuit portion 1552 includes a memory cell including a plurality of thin film transistors and an antifuse memory element. In addition, a memory cell for a test circuit is formed using a plurality of thin film transistors and an antifuse memory element.

Note that for convenience, cross sectional views illustrating two thin film transistors included in the logic circuit portion 1550, one thin film transistor and one memory element which are included in the semiconductor memory circuit portion 1552, and one capacitor and one thin film transistor which are included in the antenna portion 1554 in a manufacturing process are illustrated in FIGS. 10A to 10E, FIGS. 11A to 11E, FIGS. 12A to 12E, FIGS. 13A to 13D, and FIGS. 14A to 14C. The memory cell for the test circuit is formed to have substantially the same structure through substantially the same steps as general memory cells; therefore, it is not illustrated here.

First, a metal layer 1502 is formed over a support substrate 1501. A glass substrate is used as the support substrate 1501. As the metal layer 1502, a tungsten film, a tungsten nitride film, or a molybdenum film with a thickness of greater than or equal to 30 nm and less than or equal to 200 nm obtained by a sputtering method is used.

Next, a surface of the metal layer 1502 is oxidized to form a metal oxide layer. The metal oxide layer can be formed by oxidizing the surface of the metal layer 1502 with ozone water or oxygen plasma. Here, the metal layer 1502 and the metal oxide layer are formed as separation layers which are used as a boarder when separation is performed on a structure formed thereover in a later step.

Alternatively, the metal oxide layer may be formed by heating in an atmosphere containing oxygen. Further alternatively, the metal oxide layer may be formed in a later step of forming an insulating layer which is formed over the metal layer 1502. For example, in the case where an insulating layer such as a silicon oxide film or a silicon oxynitride film is formed over the metal layer 1502 by a plasma CVD method, a metal oxide layer is formed on the surface of the metal layer 1502 by oxidation reaction. Note that the metal oxide layer is not illustrated.

Further, a base insulating layer such as a silicon oxide film or a silicon nitride film may be provided between the metal layer 1502 and the substrate. In this example, a silicon oxynitride layer with a thickness of 100 nm and a tungsten layer with a thickness of 30 nm are stacked as the base insulating layer (not illustrated) and the metal layer, respectively (see FIG. 10A).

Next, a first insulating layer 1503 is formed over the metal layer 1502. An insulating layer such as a silicon oxide film, a silicon nitride film, or a silicon oxynitride film is formed as the first insulating layer 1503.

As an example of the first insulating layer 1503, a structure can be given in which a silicon nitride oxide film having a thickness of greater than or equal to 50 nm and less than or equal to 100 nm which is formed by a plasma CVD method using silane ($SiH_4$), ammonia ($NH_3$), and dinitrogen monoxide ($N_2O$) as reactive gases, and a silicon oxynitride film having a thickness of greater than or equal to 100 nm and less than or equal to 150 nm which is formed by a plasma CVD method using silane ($SiH_4$) and dinitrogen monoxide ($N_2O$) as reactive gases are stacked.

When the first insulating layer 1503 has a stacked-layer structure, as at least one layer of the first insulating layer 1503, a silicon nitride film or a silicon oxynitride film each having a thickness less than or equal to 10 nm is preferably formed. Alternatively, a three-layer structure may be employed in which a silicon nitride oxide film, a silicon oxynitride film, and a silicon nitride film are sequentially stacked.

Although the first insulating layer 1503 serves as a base insulating layer, it is not provided if it is not particularly needed. In this example, a stacked layer of a silicon nitride oxide film having a thickness of 50 nm and a silicon oxynitride film having a thickness of 100 nm is used as the first insulating layer 1503 (see FIG. 10B).

Next, a semiconductor layer 1570 is formed over the first insulating layer 1503. The semiconductor layer 1570 is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, or the like can be used. In a thermal crystallization method, a metal element, such as nickel, which promotes crystallization may be used.

Note that the semiconductor layer is formed to a thickness of greater than or equal to 25 nm and less than or equal to 80 nm (preferably greater than or equal to 30 nm and less than or equal to 70 nm). Although there is no particular limitation on a material of the semiconductor layer, silicon, a silicon germanium, or the like is preferably used.

Alternatively, for crystallization treatment of the semiconductor layer having an amorphous structure, a continuous wave laser can be used. In order to obtain a crystal with a large grain size in crystallization of the semiconductor layer having an amorphous structure, it is preferable to employ a second harmonic, a third harmonic, or a fourth harmonic of a solid laser capable of continuous wave oscillation.

As a typical example, the second harmonic (532 nm) or the third harmonic (355 nm) of an Nd:$YVO_4$ laser (fundamental wave of 1064 nm) may be applied. In the case of using the continuous wave laser, a laser beam emitted from a continuous wave $YVO_4$ laser having an output of 10 W is converted into harmonics by a non-linear optical element. Alternatively, there is a method in which $YVO_4$ crystal and a non-linear optical element are put in a resonator and a harmonic is emitted. It is preferable to shape the laser beam into a rectangular or elliptical laser beam on an irradiation surface by an optical system to be emitted to an object.

In this example, an amorphous silicon film with a thickness of 66 nm is formed over the first insulating layer and crystallized by laser irradiation (see FIG. 10C). For example, the energy density is set to approximately 0.01 MW/cm$^2$ to 100 MW/cm$^2$ (preferably, greater than or equal to 0.1 MW/cm$^2$ and less than or equal to 10 MW/cm$^2$). Then, the semiconductor layer may be moved at a speed of approximately 10 cm/sec to 2000 cm/sec relatively to the laser beam so as to be irradiated.

Note that if necessary, an impurity element (boron or phosphorus) is slightly added to the semiconductor layer in order to control a threshold value of a thin film transistor to be completed later. In this embodiment, boron is added to the semiconductor layer by an ion doping method in which diborane ($B_2H_6$) is excited by plasma without mass separation (see FIG. 10D).

Next, the semiconductor layer 1570 is selectively etched so that semiconductor layers 1571 to 1576 having desired shapes are formed (see FIG. 10E).

Further, an impurity element may be additionally added at a low concentration to a semiconductor layer in a region be included in an n-channel transistor in order to form a channel formation region. In this example, boron is added, with a semiconductor layer in a region to be included in a p-channel transistor covered with a resist mask 1577 (see FIG. 11A).

Next, the surface of the semiconductor layer is cleaned at the same time as removal of an oxide film on the surface of the semiconductor layer with an etchant containing hydrofluoric acid.

Then, a second insulating layer 1578 which covers the semiconductor layers is formed. The second insulating layer 1578 is formed to a thickness of greater than or equal to 1 nm and less than or equal to 200 nm by a CVD method or a sputtering method. Preferably, a single layer structure or a stacked layer structure including an insulating layer containing silicon having a thickness of greater than or equal to 10 nm and less than or equal to 50 nm is formed, and then surface nitridation treatment is performed using plasma excited by a microwave. The second insulating layer 1578 serves as a gate insulating layer of the thin film transistor to be formed later. In this example, a silicon oxynitride layer having a thickness of 10 nm is formed as the second insulating layer 1578 (FIG. 11B).

Note that in order that the semiconductor layers 1574 and 1575 in regions to become capacitors later can function as conductors, an impurity element (boron or phosphorus) is added to the semiconductor layers at a high concentration. In this case, an impurity element which imparts p-type conductivity is preferably added to a region which is used as an assist capacitor in a memory cell. Note that the region other than the region to be included in the capacitor may be covered with resist masks 1579 to 1581 (see FIG. 11C).

Next, gate electrodes 1504 to 1507, a capacitor electrode 1508, and a first electrode 1509 serving as a lower electrode of a memory element are formed over the second insulating layer. A conductive layer having a thickness of greater than or equal to 100 nm and less than or equal to 500 nm which is formed by a sputtering method is selectively etched, so that the gate electrodes 1504 to 1507, the capacitor electrode 1508, and the first electrode 1509 are formed.

As a material of the gate electrodes 1504 to 1507, the capacitor electrode 1508, and the first electrode 1509, a substance such as tungsten, titanium, aluminum, nickel, chromium, molybdenum, tantalum, cobalt, zirconium, vanadium, palladium, hafnium, platinum, or iron; an alloy or a compound thereof can be used. A material which reacts with silicon to form a silicide is preferably used. Note that a refractory metal is preferably used as the gate electrode of the thin film transistor. Specifically, the gate electrode is preferably formed using tungsten or molybdenum.

The gate electrodes 1504 to 1507, the capacitor electrode 1508, and the first electrode 1509 may have a stacked-layer structure of different materials. In that case, an upper layer may be formed using any of the above materials, and a lower layer on a gate insulating layer side may be formed using a polycrystalline silicon film to which an impurity element such as phosphorus is added. In addition, since the first electrode 1509 is used for an electrode of the antifuse in contact with amorphous silicon, a material which reacts with silicon is preferably used. In this example, a stacked layer of a 30-nm-thick tantalum nitride film and a 370-nm-thick tungsten film is used (FIG. 11D).

Next, resist masks 1582 to 1584 are formed so as to cover a region to be included in a p-channel transistor and regions to be included in capacitors. Then, an impurity element is added to semiconductor layers in regions to be included in n-channel transistors by using the gate electrodes 1505 to 1507 as masks, so that low-concentration impurity regions are formed.

As the impurity element, an impurity element imparting n-type conductivity or an impurity element imparting p-type conductivity can be used. As the impurity element imparting n-type conductivity, phosphorus, arsenic, or the like can be used. In this example, phosphorus is added to the semiconductor layers in the regions to be included in the n-channel transistors so as to be contained at a concentrations of higher than or equal to $1\times10^{15}$ atoms/cm$^3$ and lower than or equal to $1\times10^{19}$ atoms/cm$^3$, so that n-type impurity regions are formed (see FIG. 11E).

Next, the resist masks are removed, and resist masks 1585 to 1587 are formed so as to cover the semiconductor layers in the regions to be included in the n-channel transistors and the regions to be included in the capacitors. After that, an impurity element is added to the semiconductor layer in the region to be included in the p-channel transistor by using the gate electrode 1504 as a mask, so that p-type impurity regions are formed.

As the impurity element imparting p-type conductivity, boron, aluminum, gallium, or the like can be used. Here, boron is introduced into the semiconductor layer in the region to be included in the p-channel transistor so as to be contained at a concentration of greater than or equal to $1\times10^{19}$ atoms/cm$^3$ and less than or equal to $1\times10^{20}$ atoms/cm$^3$, so that the p-type impurity regions are formed.

As a result, a channel formation region 1516 and a pair of p-type impurity regions 1514 are formed in the semiconductor layer in the region to be included in the p-channel transistor in a self alignment manner. The p-type impurity regions 1514 each function as a source region or a drain region. In a similar manner, p-type impurity regions 1515 and 1517 each having a different impurity concentration are formed in the semiconductor layers in the regions to be included in the capacitors in a self alignment manner (see FIG. 12A).

Next, sidewall insulating layers 1510 are formed on side surfaces of the gate electrodes 1504 to 1507 and sidewall insulating layers 1511 are formed on side surfaces of the capacitor electrode 1508 and the first electrode 1509. A manufacturing method of the sidewall insulating layers is as follows.

First, a third insulating layer 1588 is formed so as to cover the second insulating layer 1578, the gate electrodes 1504 to 1507, the capacitor electrode 1508, and the first electrode 1509. The third insulating layer 1588 can be formed using a layer containing silicon, silicon oxide, silicon nitride, or an organic resin by a plasma CVD method, a sputtering method, or the like. Alternatively, the third insulating layer 1588 may have a single-layer structure or a stacked-layer structure of different materials. In this example, a stacked-layer structure of a 100-nm-thick silicon oxynitride film and a 200-nm-thick low temperature oxide (LTO) film is used (see FIG. 12B).

Next, the third insulating layer 1588 is selectively etched, so that insulating layers (the sidewall insulating layers 1510 and 1511) which are in contact with the side surfaces of the gate electrodes 1504 to 1507, the capacitor electrode 1508, and the first electrode 1509 are formed.

Note that part of the second insulating layer 1578 is removed by etching at the same time as the formation of the sidewall insulating layers 1510. By removal of the part of the second insulating layer 1578, a gate insulating layer 1512 is formed under each of the gate electrodes 1504 to 1507 and the sidewall insulating layers 1510. In addition, the part of the second insulating layer is removed, so that insulating layers 1513 under the capacitor electrode 1508, the first electrode 1509, and the sidewall insulating layers 1511 are formed (see FIG. 12C).

Next, resist masks 1589 to 1591 are formed so as to cover the semiconductor layer in the region to be included in the p-channel transistor and cover the regions to be included in the capacitors. Then, an impurity element is introduced into the semiconductor layers in the regions to be included in the n-channel transistors, using the gate electrodes 1505, 1506, and 1507 and the sidewall insulating layers 1510 as masks, so that high-concentration impurity regions are formed. The resist masks are removed after the impurity element is added.

In this example, phosphorus is introduced into the semiconductor layers in the regions to be included in the n-channel transistors so as to be contained at a concentration of greater than or equal to $1\times10^{19}$ atoms/cm$^3$ and less than or equal to $1\times10^{20}$ atoms/cm$^3$, so that n-type high-concentration impurity regions and n-type low-concentration impurity regions are formed. As a result, in each of the semiconductor layers in the region to be included in the n-channel transistors, a channel formation region 1520, a pair of low-concentration impurity regions 1519 functioning as lightly doped drain (LDD) regions, and a pair of high-concentration impurity regions 1518 functioning as a source region and a drain region are formed in a self alignment manner. Note that the low-concentration impurity regions 1519 functioning as LDD regions are formed under the sidewall insulating layer 1510 (see FIG. 12D).

Note that the structure is described in which the LDD regions are formed in the semiconductor layers included in the n-channel transistors and the LDD regions are not formed in the semiconductor layer included in the p-channel transistor, but an embodiment of the present invention is not limited thereto, and LDD regions may be formed in the semiconductor layers included in both the n-channel transistor and the p-channel transistor. In particular, when a gate insulating layer is thin (e.g., 10 nm or smaller), an LDD structure is preferably employed in order to increase the withstand voltage of the p-channel transistor.

Next, after formation of a fourth insulating layer 1522 containing hydrogen by a sputtering method, an LPCVD method, a plasma CVD method, or the like, activation treatment of the impurity element added to the semiconductor layers and hydrogenation treatment are performed. Heat treatment (at a temperature of higher than or equal to 300° C. and lower than or equal to 550° C. for longer than or equal to 1 hour and shorter than or equal to 12 hours) using a furnace or an RTA method using a lamp light source is used for the hydrogenation treatment and the activation treatment of the impurity element.

For example, a silicon oxynitride layer which is formed by a plasma CVD method can be used as the insulating layer 1522 containing hydrogen. Here, the thickness of the insulating layer 1522 is greater than or equal to 50 nm and less than or equal to 200 nm. In the case where the semiconductor layers are crystallized by using a metal element which promotes crystallization (e.g., nickel), gettering of nickel in the channel formation regions can also be carried out at the same time as the activation of the impurity element. Note that the insulating layer 1522 is a first layer of an interlayer insulating layer. In this example, a silicon oxynitride layer with a thickness of 50 nm is formed as the insulating layer 1522 and heat treatment is performed on the insulating layer 1522 at 550° C. for 4 hours as the hydrogenation treatment and the activation treatment of the impurity element (see FIG. 12E).

Next, an insulating layer 1523 is formed as a second layer of the interlayer insulating layer by a sputtering method, an LPCVD method, a plasma CVD method, or the like. As the insulating layer 1523, a single layer or a stacked layer of a silicon oxide film, a silicon nitride film, a silicon oxynitride film, or the like can be used. Here, the thickness of the insulating layer 1523 is greater than or equal to 300 nm and less than or equal to 800 nm. In this example, as the insulating layer, a 100-nm-thick silicon nitride oxide film and a 600-nm-thick silicon oxynitride film are stacked and subjected to heat treatment at 410° C. for one hour (see FIG. 13A).

Next, a resist mask is formed over the insulating layer 1523 and the insulating layer 1522 and the insulating layer 1523 are selectively etched, so that a first opening 1521 which reaches the first electrode 1509 is formed. Then, the resist mask is removed after etching. The diameter of the first opening 1521 may be approximately 1 μm to 6 μm. In this example, the diameter of the first opening 1521 is 2 μm (see FIG. 13B).

Then, as the memory element, a stacked layer of an amorphous silicon film and a silicon oxynitride film is formed by a sputtering method, an LPCVD method, a plasma CVD method, or the like. In this example, an amorphous silicon film with a thickness of 15 nm and a silicon oxynitride film with a thickness of 6 nm are sequentially stacked by a plasma CVD method.

Then, a resist mask is formed and the amorphous silicon film and the silicon oxynitride film are selectively etched, so that a stacked layer 1524 of the amorphous silicon film and the silicon oxynitride film, which overlaps with the first opening 1521, is formed. The stacked layer 1524 of the amorphous silicon film and the silicon oxynitride film serves as a resistant material layer of the memory element. Here, the resistant material layer corresponds to the intermediate layer 21 described in Embodiment 1. The resist mask is removed after the etching (see FIG. 13C).

Next, a resist mask is formed and the insulating layers 1522 and 1523 are selectively etched, so that contact holes 1592$a$ to 1592$j$, contact holes 1593$a$ to 1593$e$, and a second opening 1594 which reach the semiconductor layers, the gate electrode, and the first electrode 1509, respectively are formed. The resist mask is removed after the etching (see FIG. 13D).

Next, an oxide film on surfaces of the semiconductor layers and the first electrode 1509 which are exposed at bottom surfaces of the above contact holes is removed with an etchant containing hydrofluoric acid.

Next, a conductive layer is formed by a sputtering method to form an upper electrode of the memory element, the source and drain electrodes of the thin film transistors, and the like. For the conductive layer, a substance such as tungsten, titanium, aluminum, nickel, chromium, molybdenum, tantalum, cobalt, zirconium, vanadium, palladium, hafnium, platinum, or iron, or an alloy or a compound thereof can be used. In addition, the conductive layer is not limited to a single-layer structure and a stacked-layer structure of different films may be employed.

Here, it is preferable to use a material having relatively low contact resistance with the semiconductor layers which are included in the thin film transistors. For example, a three-layer structure can be employed in which an upper layer and a lower layer are titanium films and an intermediate layer is a pure aluminum film, an aluminum film containing a minute amount of silicon, an aluminum alloy film containing nickel and carbon, or the like. In this example, a three-layer structure of a 100-nm-thick titanium film, a 350-nm-thick pure aluminum film, and a 100-nm-thick titanium film is used.

Further, in this example, an example in which a tungsten layer is used as a material of the lower electrode of the memory element and a titanium layer is used as a material of the upper electrode is shown; however, there are no particular limitations on the materials as long as they can change the state of the resistance material layer from a high resistance state to a low resistance state and the same material may be used for the upper electrode and the lower electrode of the antifuse. In that case, a substance such as tungsten, titanium, aluminum, nickel, chromium, molybdenum, tantalum, cobalt, zirconium, vanadium, palladium, hafnium, platinum, or iron, an alloy material or a compound material thereof can be used. They are not limited to a single-layer structure, and a stacked structure of different films may be employed.

Next, a resist mask is formed, and the conductive layer is selectively etched to form a conductive layer 1525, a conductive layer 1526, a conductive layer 1527, a conductive layer 1528, a conductive layer 1531, a conductive layer 1532 each serving as a source electrode or a drain electrode, a wiring 1529 serving as a bit line of a selection transistor, a wiring 1530 serving as a word line, a wiring 1535, a wiring 1536, and a wiring 1537 each serving as a gate lead wiring, a second electrode 1540 and a third electrode 1541 of the semiconductor memory circuit portion, a wiring 1533 and a wiring 1534 each serving as an electrode of the capacitor of the antenna portion, and a fourth electrode 1542 of the antenna portion (see FIG. 14A).

The second electrode 1540 overlaps with the first opening 1521 to be the upper electrode of the memory element and is electrically connected to the semiconductor layer 1574 which serves as one end of electrodes of the assist capacitor. The third electrode 1541 overlaps with the second opening 1594 to be electrically connected to the first electrode 1509. Note that the fourth electrode 1542 is electrically connected to thin film transistors of the antenna portion though the connection is not illustrated here.

After etching the conductive layer, the resist mask is removed. A pad electrically connected to the bit line included in the test circuit is formed at a position where the wiring 1529 which serves as the bit line is extended at the same time as the formation of the wiring 1529. A pad electrically connected to the word line included in the test circuit is formed at a position where the wiring 1530 which serves as the word line is extended at the same time as the formation of the wiring 1530.

In this example, the thin film transistors in the logic circuit portion 1550, a thin film transistor 1558 which serves as a selection transistor in the semiconductor memory circuit portion 1552, an assist capacitor 1559, a memory element 1560, and the thin film transistor in the antenna portion 1554 can be formed over the same substrate.

In this example, a cross-sectional view illustrates the p-channel transistor and the n-channel transistor in the logic circuit portion 1550, the thin film transistor 1558, the assist capacitor 1559, and the memory element 1560 in the semiconductor memory circuit portion 1552, and the capacitor and the n-channel transistor in the antenna portion 1554. Note that the thin film transistor provided in the semiconductor memory circuit portion 1552 may be a p-channel transistor. Further, a p-channel transistor may be provided in the antenna portion 1554. Here, one n-channel transistor is illustrated for convenience.

Next, an insulating layer 1543 is formed to cover the logic circuit portion 1550, the semiconductor memory circuit portion 1552, and the antenna portion 1554. An insulating layer containing silicon oxide or an insulating layer formed using an organic resin can be used as the insulating layer 1543. The insulating layer containing silicon oxide is preferably used to improve reliability of the semiconductor device.

In the case where an antenna to be formed later is formed by a screen printing method, the insulating layer 1543 may be formed using an organic resin by a coating method because a formation surface of the antenna is preferably flat. Alternatively, the above insulating layer formed using silicon oxide or the like and an insulating layer formed using an organic resin may be stacked.

Further, the antenna to be formed later may overlap with the logic circuit portion 1550 and the semiconductor memory circuit portion 1552. In this case, the insulating layer 1543 also functions as an interlayer insulating layer to insulate the antenna from the circuit portions. In the case where the antenna has a circular shape (for example, a loop antenna) or a spiral shape, one of both ends of the antenna is connected to a wiring formed in a lower layer; thus, it is preferable to provide the insulating layer 1543. However, in the case where the antenna has a linear shape (e.g., a dipole antenna), a flat shape (e.g., a patch antenna), or the like which is used for a microwave method, the antenna can be arranged so as not to overlap with the logic circuit portion 1550 and the semiconductor memory circuit portion 1552; thus, the insulating layer 1543 is not necessarily provided.

Next, a resist mask is formed, and the insulating layer 1543 is selectively etched, so that a third opening 1595 which reaches the third electrode 1541 and a fourth opening 1596 which reaches the fourth electrode 1542 are formed. After that, a resist mask is removed (see FIG. 14B).

Next, a metal layer is formed over the insulating layer 1543. For the metal layer, titanium, nickel, gold, or the like can be used. The metal layer is formed to have a single-layer structure or a stacked-layer structure of different materials. Then, a resist mask is formed, and the metal layer is selectively etched, so that a lead wiring 1544 for the first electrode 1509 and a base film 1545 for the antenna are formed.

Note that the lead wiring 1544 and the base film 1545 can be formed by a sputtering method using a metal mask without using the resist mask, as well. By providing the base film 1545 for the antenna, contact resistance between the antenna and the fourth electrode 1542 can be reduced and adhesion between the antenna and the insulating layer 1543 can be increased. The lead wiring 1544 is not necessarily formed depending on a layout of a circuit design. The lead wiring 1544 is connected, as a cathode, to a ground power source.

Then, an antenna 1546 is formed over the base film 1545 for the antenna. The antenna 1546 can be formed by such a method in which a metal layer of aluminum, silver, or the like is formed by a sputtering method and then is selectively etched into a desired shape. Alternatively, the antenna 1546 can be formed by a screen printing method using conductive paste.

A screen printing method refers to a method in which paste or the like is provided on a screen printing plate which has a desirable opening to form paste or the like with the desirable shape on a work which is placed under the screen printing plate, with the use of a rubber, plastic, or metal blade which is called a squeegee. A screen printing method has an advantage that easy application to large-area substrates is realized and treatment can be performed at low cost (see FIG. 14C).

Next, the metal layer 1502 and the support substrate 1501 are removed by separation of a region to be included in a semiconductor device manufactured through the steps up to here. The separation step can be performed by separating the upper part which is over the first insulating layer 1503 from the support substrate 1501 with relatively less force, using an interface between the first insulating layer 1503 and the metal oxide layer, inside the metal oxide layer, or an interface between the metal oxide layer and the metal layer 1502 as a boarder. When the metal layer 1502 and the support substrate 1501 are removed, another support substrate may be bonded to the side where the antenna is provided.

Next, one sheet in which a plurality of semiconductor devices is formed is divided to individual semiconductor devices by a cutter, dicing, or the like. Note that in the case where a separation method in which semiconductor devices are picked up one by one in separating is employed, this dividing step is not needed.

Next, the semiconductor device is fixed to a sheet-like base. For the sheet-like base, plastic, paper, a prepreg, a ceramic sheet, or the like can be used. The semiconductor devices may be fixed so as to be interposed between two sheet bases, or may be fixed to one sheet base with an adhesive layer. For the adhesive layer, various adhesives such as a reactive curable adhesive, a thermosetting adhesive, a photo curable adhesive such as an ultraviolet curable adhesive, or an anaerobic adhesive can be used. Alternatively, the semiconductor device is provided inside of paper in the middle of making the paper, so that the semiconductor device can be provided inside one piece of paper.

It is possible to eliminate defects in a test stage when the semiconductor device provided with the test circuit according to one embodiment of the present invention is applied to the memory of the semiconductor device obtained through the above steps. In addition, the logic circuit portion 1550, the semiconductor memory circuit portion 1552, and the antenna portion 1554 are formed over the same substrate, whereby resistance to external force is increased, and malfunction in writing or reading data can be reduced.

The semiconductor device of this example functions as a wireless chip, and is compact, thin, and lightweight, and moreover can have flexibility. Thus, even when the semiconductor device is attached to an article, it is possible that the appearance, design, and quality of the article are not deteriorated.

The semiconductor device of this example is fixed to an article by being mounted on a printed board, being attached to a surface of the article, or being embedded in the article. The semiconductor device is embedded in paper, and bills, securities, bearer bonds, and identification certificates are formed using the paper, whereby an authentication function can be provided for these pieces of paper. Accordingly, forgery thereof can be prevented.

Usage of the semiconductor device will be described with reference to FIGS. 20A to 20F. A wireless chip can be applied to a wide range of purposes. For example, the wireless chip can be attached to bills, coins, securities, bearer bonds, identification certificates (such as driver's licenses or residence cards, see FIG. 20A), pack cases (such as wrapping paper or bottles, see FIG. 20C), recording media (such as DVD software or video tapes, see FIG. 20B), vehicles (such as bicycles, see FIG. 20D), personal belongings (such as bags or glasses), foods, plants, animals, human bodies, clothes, general merchandise, products such as electronic appliances, luggage tags (see FIGS. 20E and 20F), and the like.

Note that this example can be implemented in combination with any of the other examples or embodiments as appropriate.

EXAMPLE 2

In this example, writing operation and reading operation of an OTP memory according to one embodiment of the present invention is described with reference to a drawing.

Figure 15:
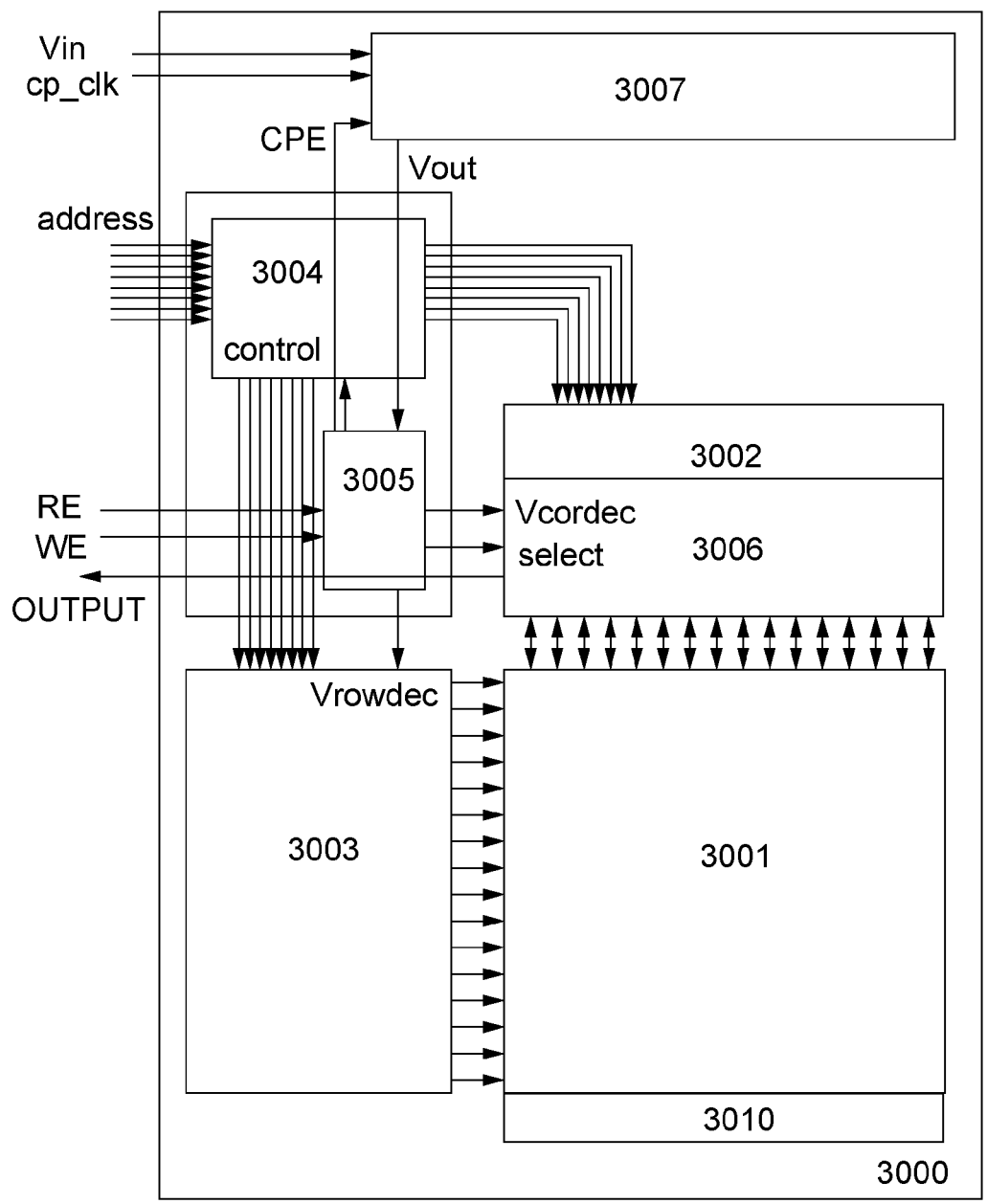
FIG. 15 is a block diagram illustrating a memory cell and a driver circuit.

FIG. 15 is a block diagram of a memory cell and circuits necessary for driving the memory cell, which are modularized. An OTP memory 3000 includes a memory cell array 3001, a column decoder 3002, a row decoder 3003, an address selector 3004, a selector 3005, a reading/writing circuit 3006, a boosting circuit 3007, a test circuit 3010, and the like. Here, the memory cell array 3001 includes a plurality of memory cells arranged in matrix.

Next, the operation of the OTP memory 3000 is described. A read enable signal (RE), a write enable signal (WE), an address signal (address), and a boosting clock signal (cp_clk) are input to the OTP memory 3000 as operation signals, and boosting input voltage Vin is supplied to the OTP memory 3000 as power supply voltage. Note that although not illustrated particularly, power supply voltage necessary for driving the circuit, such as VDD and GND, is also supplied as operating power supply voltage.

The RE and the WE are input to the selector 3005, so that the operation of the memory is determined. For example, in the case where the RE is active and the WE is non-active, reading operation is performed. Alternatively, in the case where the WE is active and the RE is non-active, writing operation is performed. In the case where the WE and the RE are both non-active, the memory is in a standby state.

In the case of performing the writing operation, a transmission of a boosting enable signal (CPE) may be a condition of the operation of the boosting circuit. Thus, unnecessary operation can be prevented when the writing operation is not performed, so that increase in current consumption due to unnecessary boosting can be suppressed. Further, in the case of performing the writing operation or the reading operation, by transmitting a control signal (control) and inputting the control signal to the address selector 3004, a malfunction due to driving of the decoder in the standby state can be prevented.

The address signal branches through the address selector 3004 and is input to the column decoder 3002 and the row decoder 3003. Each of the column decoder 3002 and the row decoder 3003 includes a plurality of decoders. In each of the column decoder 3002 and the row decoder 3003, only one of the plurality of decoders is driven in accordance with combination of values of the address signals. In addition, in accordance with combination of decoders which are driven, a memory cell for performing writing or reading is determined in the memory cell array 3001. As described above, in the state where neither writing nor reading is performed, a signal which is input to the decoder is made to be non-active with the control signal transmitted from the selector 3005 so that the decoder is not selected.

The reading/writing circuit 3006 which is connected to the column decoder 3002 drives either a reading circuit or a writing circuit, which is provided inside, with a selection signal (select) transmitted from the selector 3005. In a writing state, the writing circuit is driven, and in a reading state, the reading circuit is driven. The reading circuit reads data "0" or data "1" from the state of an accessed memory cell and outputs the data as data output (OUTPUT).

The boosting circuit 3007 is operated by the cp_clk which is an input signal from the outside when the CPE transmitted from the selector 3005 is active and amplifies the power supply voltage Vin which is applied from the outside so that it is output as Vout. The Vout is input to the selector 3005, and the selector 3005 applies the Vout as power supply voltage (Vcoldec) of the column decoder 3002 and power supply voltage (Vrowdec) of the row decoder 3003 when the circuit performs the writing operation.

Note that this example can be implemented in combination with any of the other examples or embodiments as appropriate.

EXAMPLE 3

In this example, a semiconductor device on which an OTP memory according to one embodiment of the present invention is mounted is described with reference to a drawing.

The semiconductor device of this example includes a memory circuit, stores necessary information in the memory circuit, and exchanges information with the external device by using a contactless method, for example, wireless communication. The semiconductor device utilizing this feature has an application for a unique authentication system or the like. In an individual authentication system, individual information or the like of an object is stored in a semiconductor device in advance, and the information is read to identify the object. Higher reliability is required for the semiconductor device used for such an application.

Figure 16:
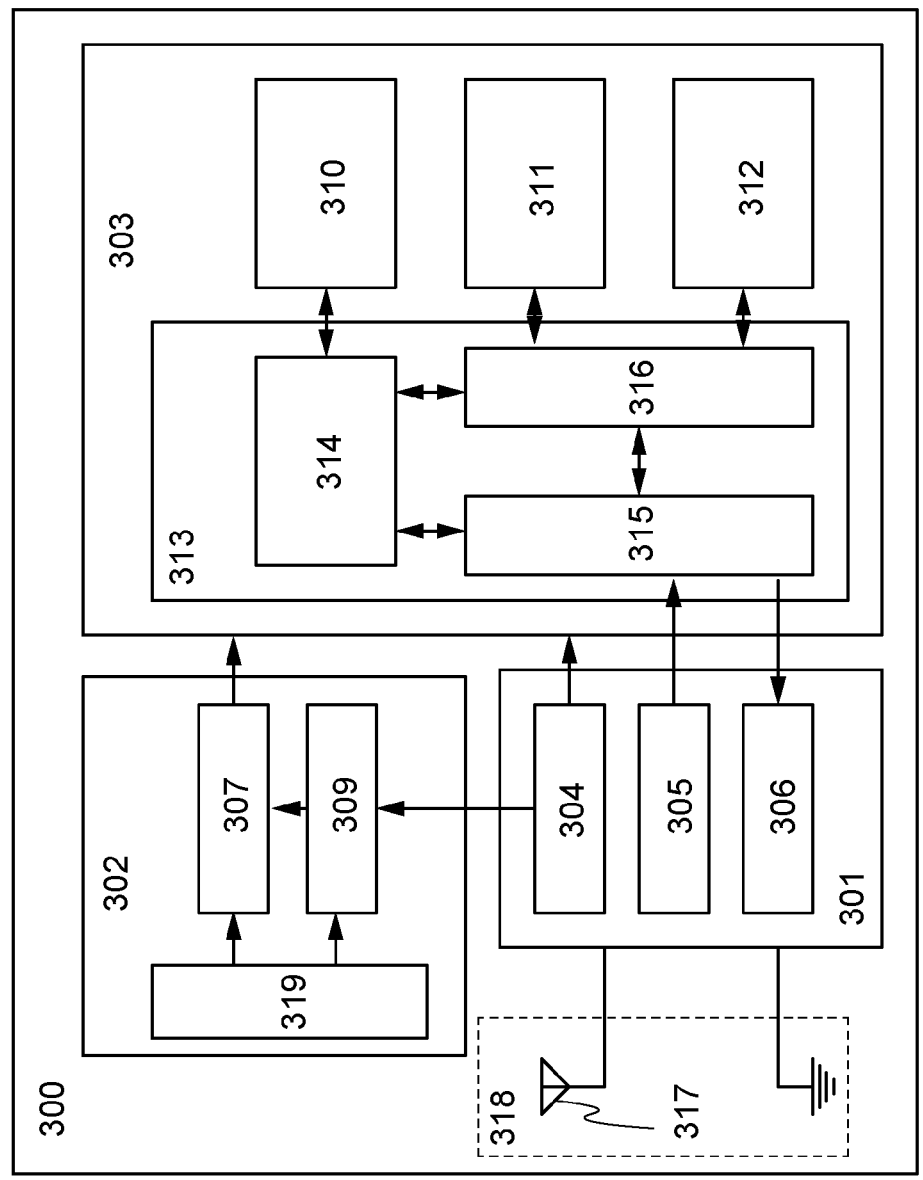
FIG. 16 is a block diagram illustrating a structural example of a semiconductor device.

FIG. 16 is a block diagram illustrating the structure of the semiconductor device of this example.

A semiconductor device 300 includes an RF circuit 301, a clock generation circuit 302, a logic circuit 303, an antenna 317 in an antenna portion 318, and the like. The semiconductor device 300 transmits and receives wireless signals to and from an external circuit such as a wireless communication device through the antenna 317. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electromagnetic wave method by which communication is performed using an electromagnetic wave. Any of these methods can be used in this example.

Next, the structure of each circuit is described. The RF circuit 301 includes a power supply circuit 304, a demodulation circuit 305, and a modulation circuit 306. The clock generation circuit 302 includes a frequency divider circuit 307, a counter circuit 309, and a reference clock generation circuit 319. The logic circuit 303 has a function of performing arithmetic processing and includes a controller 313, a CPU (also referred to as a central processing unit) 310, a memory circuit 311, and a memory circuit 312.

In addition, the controller 313 includes a CPU interface 314, an RF interface 315, and a memory controller 316.

Further, in the RF circuit 301, the power supply circuit 304 includes a rectifier circuit and a storage capacitor and has a function of generating power supply voltage from received signals and supplying the power supply voltage to the other circuits. The demodulation circuit 305 includes a rectifier circuit and an LPF (low pass filter) and has a function of extracting a command or data from communication signals. The modulation circuit 306 has a function of modulating transmission data, and modulated data is transmitted as a transmission signal from the antenna 317.

Next, the operation of the semiconductor device in this example is described. First, signals transmitted from an external communication device are received by the semiconductor device. The received signals which are input to the semiconductor device are demodulated by the demodulation circuit 305 and then input to the RF interface 315 in the controller 313. The received signals which are input to the RF interface 315 are subjected to arithmetic processing by the CPU 310 through the CPU interface 314. In addition, with the received signals which are input to the RF interface 315, access to the memory circuit 311 and the memory circuit 312 is performed through the memory controller 316.

Then, transmission data is generated after arithmetic processing is performed by the CPU 310 and data is input and output to and from the memory circuit 311 and the memory circuit 312, and the transmission data is modulated as a signal by the modulation circuit 306 and is transmitted from the antenna 317 to the external communication device.

The OTP memory according to one embodiment of the present invention can be mounted as the memory circuit 311 or the memory circuit 312 of the semiconductor device described in this example, or another memory circuit. By mounting the OTP memory according to one embodiment of the present invention, higher reliability of the semiconductor device described in this example can be ensured.

Note that this example can be implemented in combination with any of other examples or embodiments as appropriate.

This application is based on Japanese Patent Application serial no. 2010-095243 filed with Japan Patent Office on Apr. 16, 2010, the entire contents of which are hereby incorporated by reference.

What is claimed is:

1. A semiconductor device comprising:
a plurality of memory cells each including an antifuse,
wherein the antifuse includes:
a first conductive layer;
an intermediate layer over the first conductive layer, the intermediate layer comprising an insulating layer and a semiconductor layer; and
a second conductive layer over the intermediate layer,
wherein the insulating layer is a silicon oxynitride film including hydrogen at greater than or equal to $1.2 \times 10^{21}$ atoms/cm$^3$ and less than or equal to $3.4 \times 10^{21}$ atoms/cm$^3$.

2. The semiconductor device according to claim 1,
wherein the insulating layer includes nitrogen at greater than or equal to $3.2 \times 10^{20}$ atoms/cm$^3$ and less than or equal to $2.2 \times 10^{21}$ atoms/cm$^3$.

3. The semiconductor device according to claim 1,
wherein the semiconductor layer is an amorphous silicon film.

4. The semiconductor device according to claim 1,
wherein the first conductive layer comprises a tantalum nitride film and a tungsten film, and
wherein the intermediate layer is in contact with the tungsten film.

5. The semiconductor device according to claim 1,
wherein the second conductive layer comprises a titanium film and an aluminum film, and
wherein the intermediate layer is in contact with the titanium film.

6. The semiconductor device according to claim 1,
wherein the plurality of memory cells are sandwiched between a first insulator and a second insulator, and
wherein each of the first insulator and the second insulator includes a fibrous body which is impregnated with an organic resin.

7. The semiconductor device according to claim 1,
wherein the silicon oxynitride film is formed with a mixture gas comprising an ammonia gas.

8. A semiconductor device comprising:
a memory portion including a plurality of memory cells each including an antifuse;
a semiconductor integrated circuit portion connected to the memory portion;
an antenna portion connected to the semiconductor integrated circuit portion; and
a first insulator and a second insulator between which the memory portion, the semiconductor integrated circuit portion, and the antenna portion are sandwiched,
wherein the antifuse includes:
  a first conductive layer;
  an intermediate layer over the first conductive layer, the intermediate layer comprising an insulating layer and a semiconductor layer; and
  a second conductive layer over the intermediate layer,
wherein the insulating layer is a silicon oxynitride film including hydrogen at greater than or equal to $1.2\times10^{21}$ atoms/cm$^3$ and less than or equal to $3.4\times10^{21}$ atoms/cm$^3$.

9. The semiconductor device according to claim 8,
wherein the insulating layer includes nitrogen at greater than or equal to $3.2\times10^{20}$ atoms/cm$^3$ and less than or equal to $2.2\times10^{21}$ atoms/cm$^3$.

10. The semiconductor device according to claim 8,
wherein the semiconductor layer is an amorphous silicon film.

11. The semiconductor device according to claim 8,
wherein the first conductive layer comprises a tantalum nitride film and a tungsten film, and
wherein the intermediate layer is in contact with the tungsten film.

12. The semiconductor device according to claim 8,
wherein the second conductive layer comprises a titanium film and an aluminum film, and
wherein the intermediate layer is in contact with the titanium film.

13. The semiconductor device according to claim 8,
wherein the semiconductor integrated circuit portion performs wireless communication with an external device through the antenna portion.

14. The semiconductor device according to claim 8,
wherein each of the first insulator and the second insulator includes a fibrous body which is impregnated with an organic resin.

15. The semiconductor device according to claim 8,
wherein the silicon oxynitride film is formed with a mixture gas comprising an ammonia gas.

16. A semiconductor device comprising:
a plurality of memory cells each including an antifuse,
wherein the antifuse includes:
  a first conductive layer;
  an intermediate layer over the first conductive layer, the intermediate layer comprising an insulating layer and a semiconductor layer; and
  a second conductive layer over the intermediate layer,
wherein the insulating layer is a silicon oxynitride film including nitrogen at greater than or equal to $3.2\times10^{20}$ atoms/cm$^3$ and less than or equal to $2.2\times10^{21}$ atoms/cm$^3$.

17. The semiconductor device according to claim 16,
wherein the semiconductor layer is an amorphous silicon film.

18. The semiconductor device according to claim 16,
wherein the first conductive layer comprises a tantalum nitride film and a tungsten film, and
wherein the intermediate layer is in contact with the tungsten film.

19. The semiconductor device according to claim 16,
wherein the second conductive layer comprises a titanium film and an aluminum film, and
wherein the intermediate layer is in contact with the titanium film.

20. The semiconductor device according to claim 16,
wherein the plurality of memory cells are sandwiched between a first insulator and a second insulator, and
wherein each of the first insulator and the second insulator includes a fibrous body which is impregnated with an organic resin.

21. The semiconductor device according to claim 16,
wherein the silicon oxynitride film is formed with a mixture gas comprising an ammonia gas.

22. A semiconductor device comprising:
a memory portion including a plurality of memory cells each including an antifuse;
a semiconductor integrated circuit portion connected to the memory portion;
an antenna portion connected to the semiconductor integrated circuit portion; and
a first insulator and a second insulator between which the memory portion, the semiconductor integrated circuit portion, and the antenna portion are sandwiched,
wherein the antifuse includes:
  a first conductive layer;
  an intermediate layer over the first conductive layer, the intermediate layer comprising an insulating layer and a semiconductor layer; and
  a second conductive layer over the intermediate layer,
wherein the insulating layer is a silicon oxynitride film including nitrogen at greater than or equal to $3.2\times10^{20}$ atoms/cm$^3$ and less than or equal to $2.2\times10^{21}$ atoms/cm$^3$.

23. The semiconductor device according to claim 22,
wherein the semiconductor layer is an amorphous silicon film.

24. The semiconductor device according to claim 22,
wherein the first conductive layer comprises a tantalum nitride film and a tungsten film, and
wherein the intermediate layer is in contact with the tungsten film.

25. The semiconductor device according to claim 22,
wherein the second conductive layer comprises a titanium film and an aluminum film, and
wherein the intermediate layer is in contact with the titanium film.

26. The semiconductor device according to claim 22,
wherein the semiconductor integrated circuit portion performs wireless communication with an external device through the antenna portion.

27. The semiconductor device according to claim 22,
wherein each of the first insulator and the second insulator includes a fibrous body which is impregnated with an organic resin.

28. The semiconductor device according to claim 22,
wherein the silicon oxynitride film is formed with a mixture gas comprising an ammonia gas.

* * * * *